(12) United States Patent
Noguchi et al.

(10) Patent No.: US 8,293,380 B2
(45) Date of Patent: Oct. 23, 2012

(54) POLYMER COMPOUND AND POLYMER LIGHT EMITTING DEVICE USING THE SAME

(75) Inventors: Takanobu Noguchi, Tsukuba (JP); Hidenobu Kakimoto, Tsukuba (JP); Tomoyuki Suzuki, Nishitokyo (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 770 days.

(21) Appl. No.: 11/722,231

(22) PCT Filed: Dec. 26, 2005

(86) PCT No.: PCT/JP2005/024211
§ 371 (c)(1),
(2), (4) Date: Jun. 20, 2007

(87) PCT Pub. No.: WO2006/070911
PCT Pub. Date: Jul. 6, 2006

(65) Prior Publication Data
US 2008/0088228 A1  Apr. 17, 2008

(30) Foreign Application Priority Data

Dec. 27, 2004  (JP) .................................. 2004-375924
Jan. 28, 2005  (JP) .................................. 2005-020961

(51) Int. Cl.
*H01L 51/54* (2006.01)
(52) U.S. Cl. ........ 428/690; 428/917; 313/504; 313/505; 313/506; 546/79
(58) Field of Classification Search .................. 428/690, 428/917; 313/504, 505, 506; 546/79
See application file for complete search history.

(56) References Cited

U.S. PATENT DOCUMENTS

| 4,049,376 | A |   | 9/1977 | Le Pape |
|---|---|---|---|---|
| 4,080,355 | A |   | 3/1978 | Le Pape |
| 4,869,982 | A | * | 9/1989 | Murphy ........................ 430/58.3 |
| 7,723,455 | B2 | * | 5/2010 | Becker et al. ....................... 528/8 |
| 2002/0033910 | A1 | * | 3/2002 | Ohnishi et al. .................. 349/69 |
| 2003/0023097 | A1 | * | 1/2003 | Otani et al. ................. 548/301.7 |

FOREIGN PATENT DOCUMENTS

| JP | 45-11518 | B1 |   | 4/1970 |
|---|---|---|---|---|
| JP | 52-135337 | A |   | 11/1977 |
| JP | 58-154718 | A |   | 9/1983 |
| JP | 64-026641 | A |   | 1/1989 |
| JP | 04-204438 |   | * | 7/1992 |
| JP | 10-506426 | A |   | 6/1998 |
| JP | 2000-313739 | A |   | 11/2000 |
| JP | 2001-026641 | A |   | 1/2001 |
| JP | 2001-164141 | A |   | 6/2001 |
| JP | 2001-181619 | A |   | 7/2001 |
| JP | 2001-509832 | A |   | 7/2001 |
| JP | 2002-275249 |   | * | 9/2002 |
| JP | 2003-109763 |   | * | 4/2003 |
| JP | 2004-137456 | A |   | 5/2004 |
| JP | 2004-536896 | A |   | 12/2004 |
| JP | 2005-292734 | A |   | 10/2005 |
| WO | WO 2004/061048 |   | * | 7/2004 |
| WO | WO 2004-061048 | A |   | 7/2004 |
| WO | WO 2005/014689 |   | * | 2/2005 |

OTHER PUBLICATIONS

Hiramoto et. al., Photoinduced Hole Injection . . . Quinacridone Pigment, 1996, Jpn. J. Appl. Phys. vol. 35. p. L349-L351.*
J.Z. Ruan et al., "Synthesis and Properties of Poly(1,2-8,9-trans-Quinacridono)", Journal of Polymer Science: Part B: Polymer Physics, vol. 26, (1988), pp. 1483-1494.
H. Ueno et al., "Surface Modification of an Organic Pigment by Grafting of Polymers: Graft Polymerization of Vinyl Monomers Initiated by Peroxyester Groups Introduced onto Quinacridone Surface", J. Jpn. Soc. Colour Mater., (Shikizai), 69(11), 1996, pp. 743-749.
English translation of Office Action issued Jan. 18, 2011, received from the Japanese Patent Office, in Japanese Patent Application No. 2005-371744.
Office Action issued Jan. 18, 2011, received from the Japanese Patent Office, in Japanese Patent Application No. 2005-371744.

* cited by examiner

*Primary Examiner* — Jennifer Chriss
*Assistant Examiner* — Gregory Clark
(74) *Attorney, Agent, or Firm* — Sughrue Mion, PLLC

(57) ABSTRACT

A polymer compound containing a structure of the following formula (B):

—Ar—  (A)

(wherein, Ar represents an arylene group, divalent heterocyclic group, divalent aromatic amine group or divalent group having a metal complex structure.)

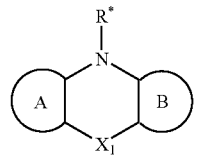

(B)

(wherein, A ring and B ring represent each independently an aromatic ring optionally having a substituent. $X_1$ represents —C(=O)—, —S(=O)—, —S(=O)$_2$—, —P(=O)(R$_1$)—, —C(R$_1$)(R$_2$)—, —C(R$_2$)(R$_2$)—, —B(R$_1$)—, —N(R$_1$)— or —Si(R$_1$)(R$_1$)—. R* represents a hydrogen atom or monovalent or divalent group, $R_1$ represents a hydrogen atom or monovalent group, and $R_2$ represents a monovalent group having a hetero atom. When $R_1$ and $R_2$ are present each in plural number, they may be the same or different).

21 Claims, No Drawings

POLYMER COMPOUND AND POLYMER LIGHT EMITTING DEVICE USING THE SAME

TECHNOLOGICAL FIELD

The present invention relates to a polymer compound and a polymer light emitting device (hereinafter, referred to as polymer LED in some cases) using the polymer compound.

BACKGROUND TECHNOLOGY

Light emitting materials of higher molecular weight are soluble in solvents and capable of forming a light emitting layer in a light emitting device by an application method, differing from light emitting materials of lower molecular weight, thus, have been investigated variously, and for example, there are known polyphenylenevinylene derivatives, polyfluorene derivatives, polyphenylene derivatives and the like.

DISCLOSURE OF THE INVENTION

The present invention has an object of providing a novel polymer compound useful as a light emitting material, and a polymer light emitting device using this polymer compound.

That is, the present invention provides the following polymer compounds [1] to [3].

[1] A polymer compound having one or more repeating units of the following formula (A) and containing further a structure of the following formula (B):

—Ar—  (A)

(wherein, Ar represents an arylene group, divalent heterocyclic group, divalent aromatic amine group or divalent group having a metal complex structure.)

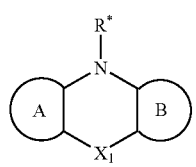

(B)

(wherein, A ring and B ring represent each independently an aromatic ring optionally having a substituent. $X_1$ represents —C(=O)—, —S(=O)—, —S(=O)$_2$—, —P(=O)($R_1$)—, —C($R_1$)($R_2$)—, —C($R_2$)($R_2$)—, —B($R_1$)—, —N($R_1$)— or —Si($R_1$)($R_1$)—. R* represents a hydrogen atom or monovalent or divalent group, $R_1$ represents a hydrogen atom or monovalent group, and $R_2$ represents a monovalent group having a hetero atom. When $R_1$ and $R_2$ are present each in plural number, they may be the same or different).

[2] The above-described polymer compound, containing a repeating unit of the following formula (2):

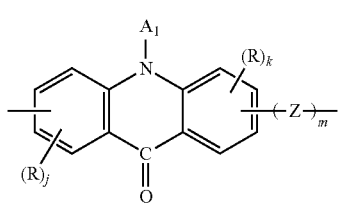

(2)

(wherein, Z represents —CR$_3$=CR$_4$— or —C≡C—. R$_3$ and R$_4$ represent each independently a hydrogen atom, alkyl group, aryl group, monovalent heterocyclic group or cyano group. j and k represent each independently an integer of 0 to 3. m represents 0 or 1. A$_1$ represents a hydrogen atom, alkyl group, aryl group, arylalkyl group, aryloxyalkyl group, monovalent heterocyclic group or divalent group. R represents a hydrogen atom, alkyl group, alkoxy group, alkylthio group, alkylsilyl group, alkylamino group, aryl group, aryloxy group, arylalkyl group, arylalkoxy group, arylalkenyl group, arylalkynyl group, arylamino group, monovalent heterocyclic group or cyano group. j and k represent each independently an integer from 0 to 3. When a plurality of Rs are present, they may be the same or different).

[3] The above-described polymer compound, containing a repeating unit of the following formula (3):

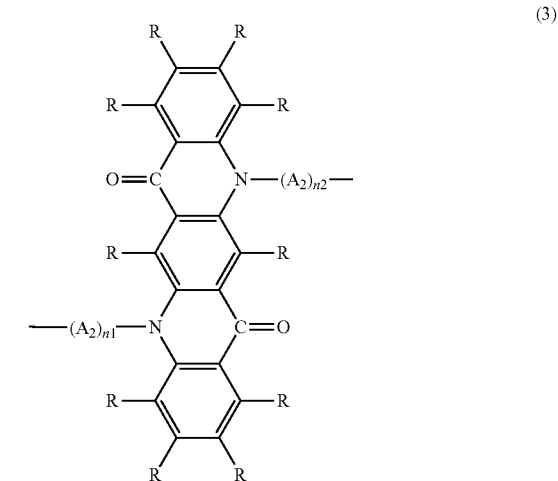

(3)

(wherein A$_2$s represent each independently a group of the following formula (4):

*-(Ar$_1$)$j_1$-(X)$k_1$-(Ar$_2$)$p_1$-(Y)$q_1$-  (4)

(wherein, Ar$_1$ and Ar$_2$ represent each independently an arylene group, divalent heterocyclic group or divalent aromatic amine group, X represents —R$_7$—, —O—R$_7$—, —R$_7$—O—, —R$_7$—C(O)O—, —R$_7$—OC(O)—, —R$_7$—N(R$_{20}$)—, —O—, —S—, —C(O)O— or —C(O)—, Y represents —C(R$_{20}$)=C(R$_{20}$)— or —C≡C—, j$_1$, k$_1$, p$_1$ and q$_1$ are each independently 0 or 1, R$_7$ represents an alkylene group, R$_{20}$ represents a hydrogen atom, alkyl group, aryl group, monovalent heterocyclic group or cyano group, and * represents a site to be connected to N.), n$_1$ and n$_2$ represent each independently 0 or 1, and R is as described above. A plurality of Rs may be the same or different).

BEST MODES FOR CARRYING OUT THE INVENTION

The polymer compound of the present invention contains one or more repeating units of the above-described formula (A) and contains further a structure of the above-described formula (B).

The case of containing a structure of the above-described formula (B) in a polymer compound includes cases of containing a structure of the above-described formula (B) at any of the main chain, side chain and end of a polymer compound, or cases of containing a structure containing the above-described formula (B) as a partial structure at any of the main chain, side chain and end of a polymer compound.

As the structure containing the above-described formula (B) as a partial structure, for example, the following structure is mentioned.

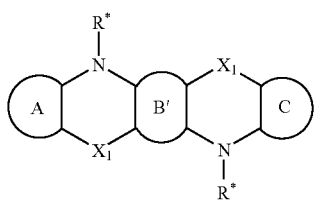

(wherein, A ring, $X_1$ and R* represent the same meanings as described above. B' ring and C ring represent each independently an aromatic ring optionally having a substituent).

There are a case of containing one structure of the above-described formula (B) in the main chain in a polymer compound, a case of containing the structure as a unit in the main chain of a repeating polymer compound, a case of containing the structure in the side chain of a polymer compound, and a case of containing the structure at the end of a polymer compound.

The structure of the above-described formula (B) is, when contained as a repeating unit in the main chain in a polymer compound, contained in an amount of preferably 0.1 mol % or more, more preferably 0.1 mol % or more and 90 mol % or less based on the total amount of all repeating units in the polymer compound of the present invention, from the standpoint of light emitting efficiency.

When the structure of the above-described formula (B) is represented by the following formula (B-2), the structure is present at the side chain or end of a polymer compound. In this case, the structure of the above-described formula (B) may be or may not be contained in a repeating unit of a polymer compound.

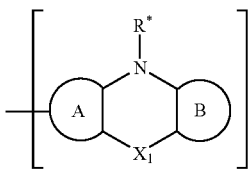

(B-2)

When the Structure of the Above-Described Formula (B) is contained in the main chain of a polymer compound, branching may exist at a site in the above-described formula (B).

In the above-described formula (B), A ring and B ring represent each independently an aromatic ring optionally having a substituent. The aromatic ring includes aromatic hydrocarbon rings such as a benzene ring, naphthalene ring, anthracene ring, phenanthrene ring, pyrene ring, perylene ring, tetracene ring, pentacene ring and the like; and heteroaromatic rings such as a pyridine ring, pyrimidine ring, pyridazine ring, pyrazine ring, quinoline ring, isoquinoline ring, quinoxaline ring, quinazoline ring, acridine ring, phenanthroline ring, thiophene ring, benzothiophene ring, dibenzothiophene ring, thiophene oxide ring, benzothiophene oxide ring, dibenzothiophenen oxide ring, furan ring, benzofuran ring, pyrrole ring, indole ring, dibenzopyrrole ring, silole ring, benzosilole ring, dibenzosilole ring, borole ring, benzoborole ring, dibenzoborole ring and the like. From the standpoint of heat resistance, fluorescence intensity, device properties and the like, preferable are aromatic hydrocarbon rings, and among others, a benzene ring, naphthalene ring, anthracene ring and phenanthrene ring are preferable. As specific examples of B' ring and C ring in the above-described examples of a structure containing the above-described formula (B), the same examples as for the above-mentioned A ring and B ring are mentioned.

As the combination of A ring and B ring, preferably mentioned are combinations of benzene ring and benzene ring, benzene ring and naphthalene ring, benzene ring and anthracene ring, benzene ring and phenanthrene ring, naphthalene ring and anthracene ring, naphthalene ring and phenanthrene ring, and anthracene ring and phenanthrene ring, and more preferable is a combination of benzene ring and benzene ring.

R* in the above-described formula (B) represents a hydrogen atom; a monovalent group such as an alkyl group, aryl group, arylalkyl group, aryloxyalkyl group, monovalent heterocyclic group and the like; or a divalent group.

From the standpoint of light emitting efficiency, preferable is an alkyl group, aryl group, arylalkyl group, aryloxyalkyl group or monovalent heterocyclic group. From the standpoint of solubility, preferable is an alkyl group, arylalkyl group or aryloxyalkyl group.

Here, the alkyl group may be any of linear, branched or cyclic, and has a carbon number of usually about 1 to 20, and as specific examples thereof, a methyl group, ethyl group, propyl group, i-propyl group, butyl group, i-butyl group, t-butyl group, pentyl group, hexyl group, cyclohexyl group, heptyl group, octyl group, 2-ethylhexyl group, nonyl group, decyl group, 3,7-dimethyloctyl group, lauryl group and the like are mentioned, and preferable are a methyl group, ethyl group, propyl group, butyl group, pentyl group, hexyl group, octyl group, 2-ethylhexyl group, decyl group and 3,7-dimethyloctyl group.

The aryl group has a carbon number of usually about 6 to 60, and as specific examples thereof, a phenyl group, $C_1$ to $C_{12}$ alkoxyphenyl groups ($C_1$ to $C_{12}$ means a carbon number of 1 to 12. Applicable also in the later descriptions), $C_1$ to $C_{12}$ alkylphenyl groups, 1-naphthyl group, 2-naphthyl group and the like are exemplified, and preferable are a phenyl group, $C_1$ to $C_{12}$ alkoxyphenyl groups and $C_1$ to $C_{12}$ alkylphenyl groups.

The arylalkyl group has a carbon number of usually about 7 to 60, and as specific examples thereof, phenyl-$C_1$ to $C_{12}$ alkyl groups, $C_1$ to $C_{12}$ alkoxyphenyl-$C_1$ to $C_{12}$ alkyl groups, $C_1$ to $C_{12}$ alkylphenyl-$C_1$ to $C_{12}$ alkyl groups, 1-naphthyl-$C_1$ to $C_{12}$ alkyl groups, 2-naphthyl-$C_1$ to $C_{12}$ alkyl groups and the like are exemplified, and preferable are $C_1$ to $C_{12}$ alkoxyphenyl-$C_1$ to $C_{12}$ alkyl groups and $C_1$ to $C_{12}$ alkylphenyl-$C_1$ to $C_{12}$ alkyl groups.

The aryloxyalkyl group has a carbon number of usually about 7 to 60, and as specific examples thereof, phenyloxy-$C_1$ to $C_{12}$ alkyl groups, $C_1$ to $C_{12}$ alkoxyphenyloxy-$C_1$ to $C_{12}$ alkyl groups, $C_1$ to $C_{12}$ alkylphenyloxy-$C_1$ to $C_{12}$ alkyl groups, 1-naphthyloxy-$C_1$ to $C_{12}$ alkyl groups, 2-naphthyloxy-$C_1$ to $C_{12}$ alkyl groups and the like are exemplified, and preferable are $C_1$ to $C_{12}$ alkoxyphenyloxy-$C_1$ to $C_{12}$ alkyl groups and $C_1$ to $C_{12}$ alkylphenyloxy-$C_1$ to $C_{12}$ alkyl groups.

The monovalent heterocyclic group means an atom group remaining after removal of one hydrogen atom from a heterocyclic compound. The monovalent heterocyclic group has a carbon number of usually about 4 to 60, and specifically, a thienyl group, $C_1$ to $C_{12}$ alkylthienyl groups, pyrrolyl group, furyl group, pyridyl group, $C_1$ to $C_{12}$ alkylpyridyl groups and the like are exemplified, and preferable are a thienyl group, $C_1$ to $C_{12}$ alkylthienyl groups, pyridyl group and $C_1$ to $C_{12}$ alkylpyridyl groups.

In the polymer compound of the present invention, it is preferable from the standpoint of light emitting efficiency that the light emitting wavelength of a polymer compound composed of a structure of the above-mentioned formula (B) is longer by 30 nm or more than the light emitting wavelength of a polymer compound composed of a structure of the above-mentioned formula (A).

In the formula, $X_1$ represents —C(=O)—, —S(=O)—, —S(=O)$_2$—, —P(=O)($R_1$)—, —C($R_1$)($R_2$)—, —C($R_2$)($R_2$)—, —B($R_1$)—, —N($R_1$)— or —Si($R_1$)($R_1$)—. Among them, —C(=O)— is preferable. Here, $R_1$s represent each independently a hydrogen atom; a monovalent group such as an alkyl group, aryl group, arylalkyl group, aryloxyalkyl group, monovalent heterocyclic group and the like. $R_2$s represent each independently a monovalent group having a hetero atom (specifically mentioned are alkoxy groups, alkylamino groups, alkylthio groups, alkyloxyalkyl groups, alkylaminoalkyl groups, alkylthioalkyl groups, aryloxy groups, aryloxyalkyl groups, alkyl groups in which one or more hydrogen atoms are substituted by a halogen atom, monovalent heterocyclic groups and the like).

Among structures of the above-described formula (B), structures of the following formula (1) are preferable.

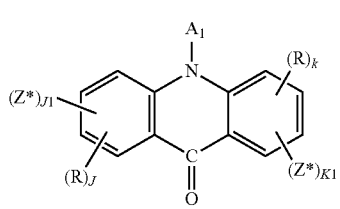
(1)

(wherein, $A_1$ represents a hydrogen atom, alkyl group, aryl group, arylalkyl group, aryloxyalkyl group, monovalent heterocyclic group or divalent group. R represents a hydrogen atom, alkyl group, alkoxy group, alkylthio group, alkylsilyl group, alkylamino group, aryl group, aryloxy group, arylalkyl group, arylalkoxy group, arylalkenyl group, arylalkynyl group, arylamino group, monovalent heterocyclic group or cyano group. Z*s represent each independently a direct bond or R. J and K represent each independently an integer from 0 to 3. J1 and K1 represent each independently 0 or 1. When a plurality of Rs are present, they may be the same or different).

In the above-described formula (1), J and K represent each independently an integer from 0 to 3. When the structure of the above-described formula (1) is a structure of the above-described formula (2), J and K in the formula (1) represent an integer from 0 to 3, and J1 and K1 are both 1, and Z represent a direct bond (namely, connecting bond). In this case, J and K in the above-mentioned formula (1) are preferably 0 from the standpoint of easiness of synthesis, and preferably 1 to 3 from the standpoint of solubility, light emitting efficiency and the like.

In the above-described formula (A), Ar represents an arylene group, divalent heterocyclic group, divalent aromatic amine group or divalent group having a metal complex structure.

The arylene group is an atomic group in which two hydrogen atoms of an aromatic hydrocarbon are removed, and usually, the number of carbon atoms is about 6 to 60. The number of carbon atoms does not include the number of carbon atoms of substituents. The aromatic hydrocarbon includes those having a condensed ring, an independent benzene ring, or two or more condensed rings bonded through groups, such as a direct bond or a vinylene group.

Examples of the arylene group include phenylene group (for example, following formulas 1-3), naphthalenediyl group (following formulas 4-13), anthracenylene group (following formulas 14-19), biphenylene group (following formulas 20-25), triphenyl group (following formulas 26-28), condensed ring compound group (following formulas 29-38), stilbene-diyl (following formulas A-D), distilbene-diyl (following formulas E, F), benzofluorene-diyl (following formulas G, H, I, K), etc.

Among them, phenylene group, biphenylene group, fluorene-diyl group (following formulas 36-38), stilbene-diyl group (following formulas A-D), distilbene-diyl (following formulas E, F), benzofluorene-diyl (following formulas G, H, I, K), are preferable.

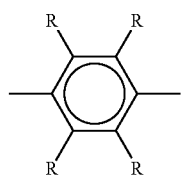
1

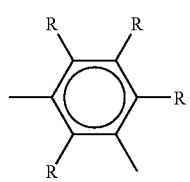
2

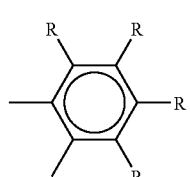
3

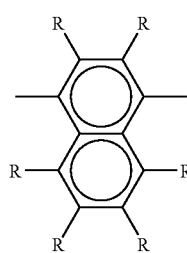
4

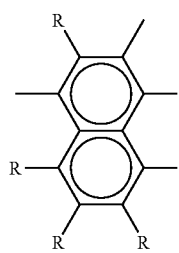
5

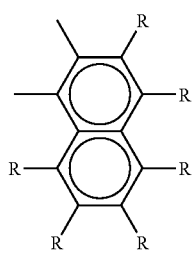
6
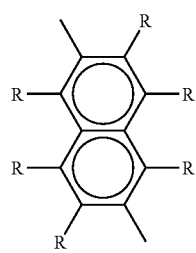
12
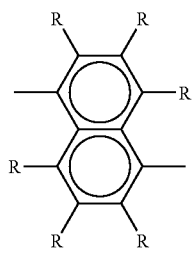
7
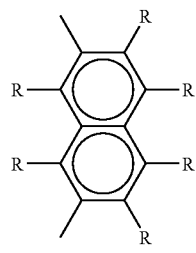
13
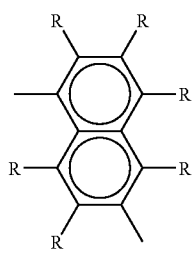
8
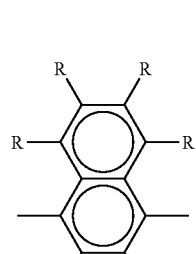
14
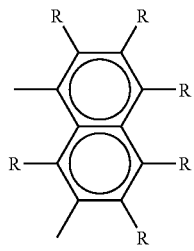
9
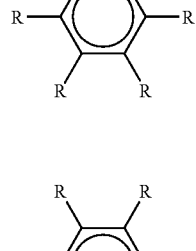
15
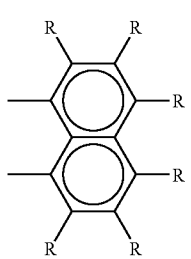
10
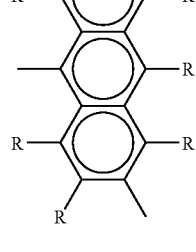
11
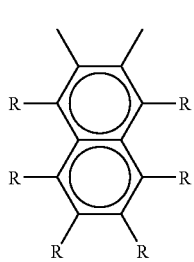
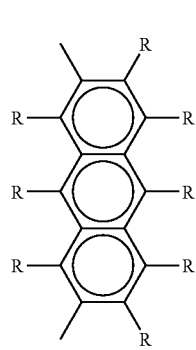
16

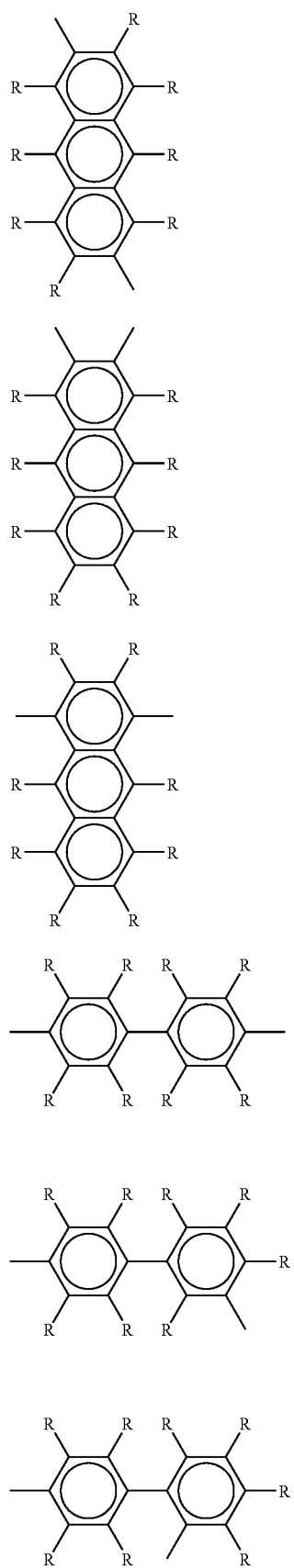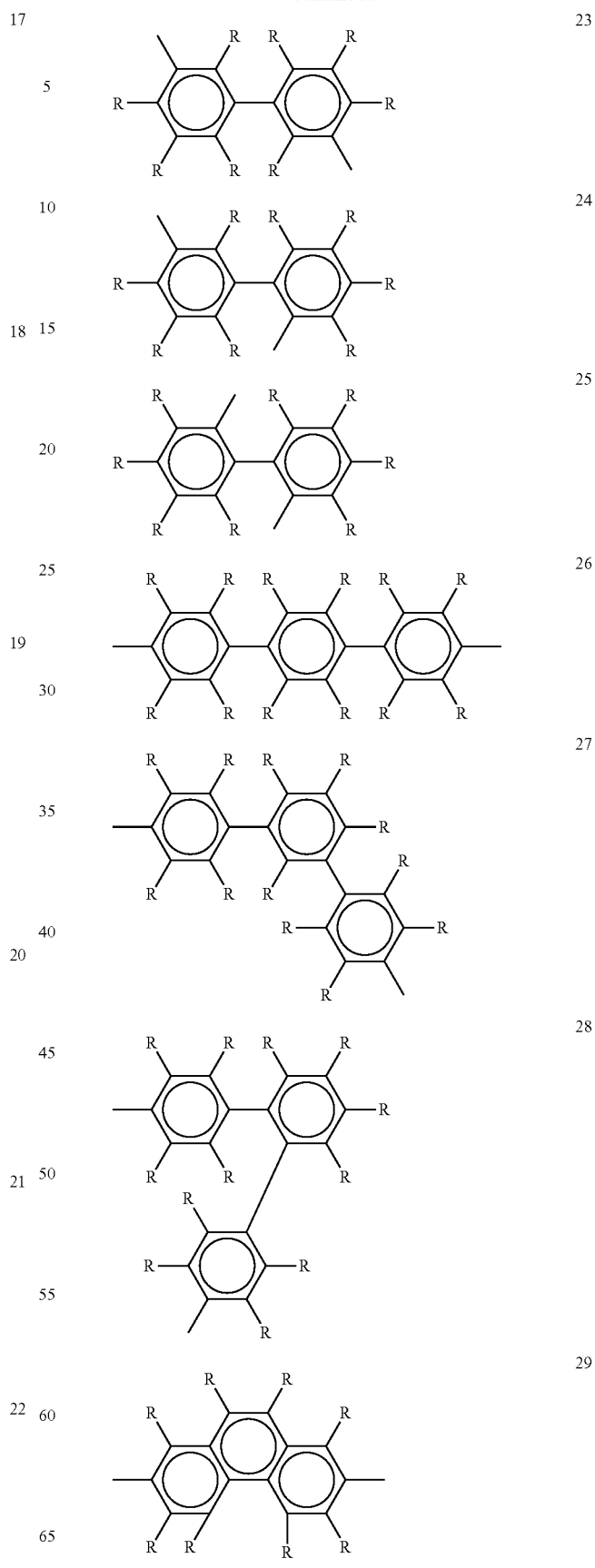

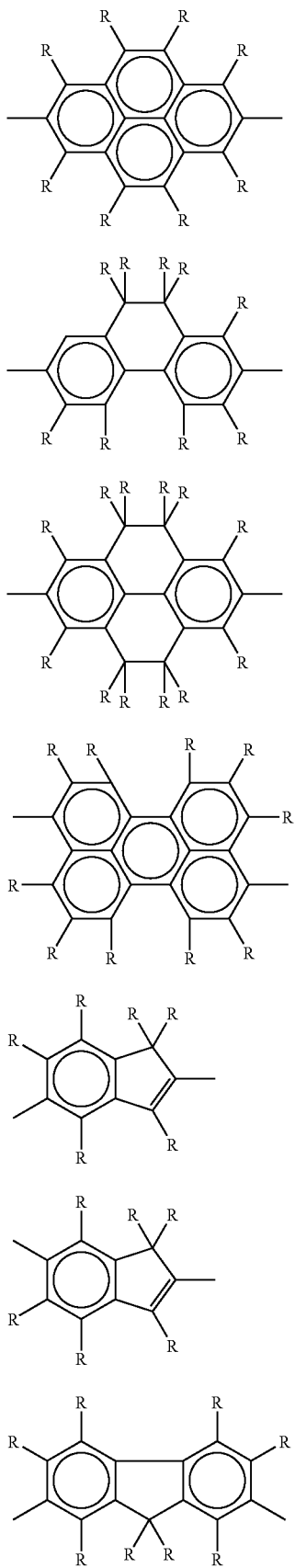
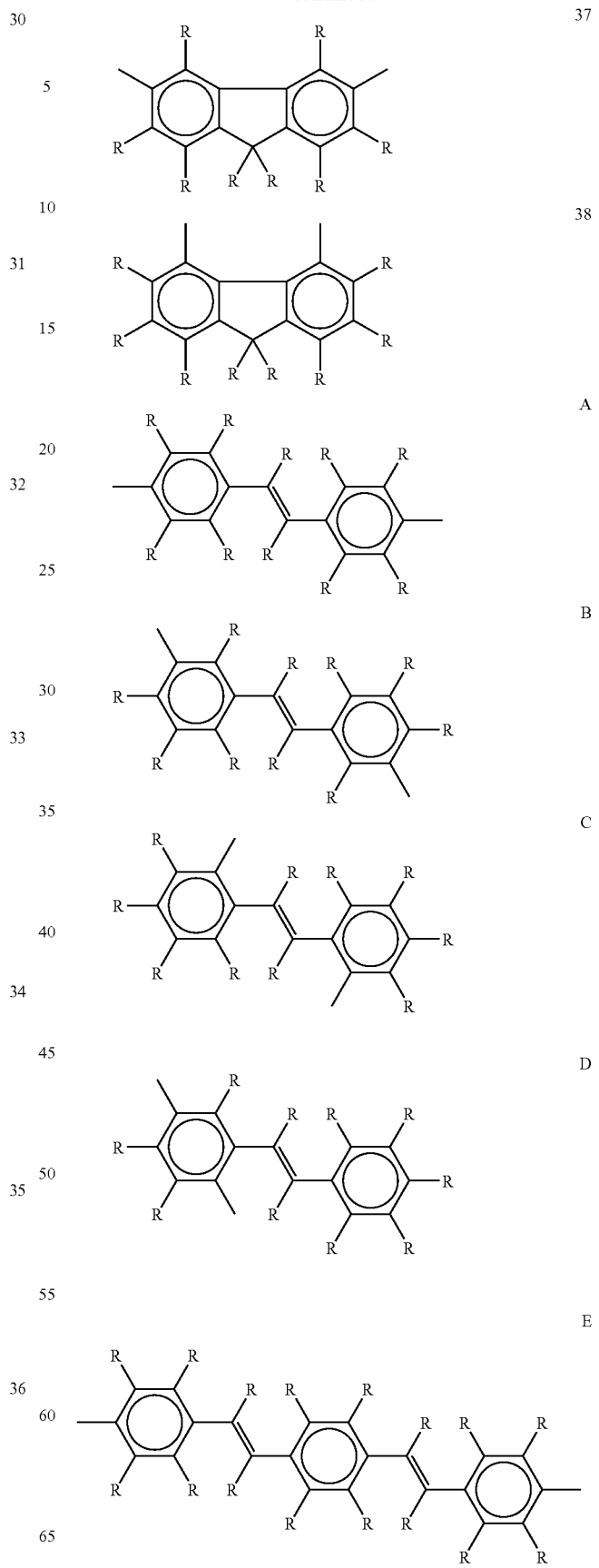

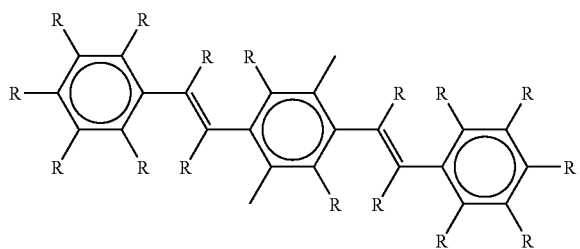

F

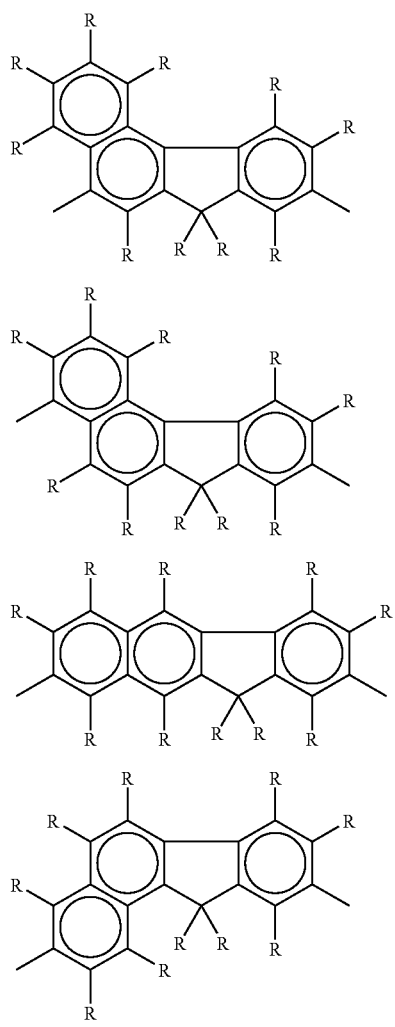

In the above-mentioned formulae 1 to 38 and A to K, R represents a hydrogen atom, alkyl group, alkoxy group, alkylthio group, alkylsilyl group, alkylamino group, aryl group, aryloxy group, arylalkyl group, arylalkoxy group, arylalkenyl group, arylalkynyl group, arylamino group, monovalent heterocyclic group or cyano group. When a plurality of Rs are present, they may be the same or different.

Here, the alkyl group may be any of linear, branched or cyclic, and has a carbon number of usually about 1 to 20, and as specific examples thereof a methyl group, ethyl group, propyl group, i-propyl group, butyl group, i-butyl group, t-butyl group, pentyl group, hexyl group, cyclohexyl group, heptyl group, octyl group, 2-ethylhexyl group, nonyl group, decyl group, 3,7-dimethyloctyl group, lauryl group and the like are mentioned, and preferable are a pentyl group, hexyl group, octyl group, 2-ethylhexyl group, decyl group and 3,7-dimethyloctyl group.

The alkoxy group may be any of linear, branched or cyclic, and has a carbon number of usually about 1 to 20, and as specific examples thereof, a methoxy group, ethoxy group, propyloxy group, i-propyloxy group, butoxy group, i-butoxy group, t-butoxy group, pentyloxy group, hexyloxy group, cyclohexyloxy group, heptyloxy group, octyloxy group, 2-ethylhexyloxy group, nonyloxy group, decyloxy group, 3,7-dimethyloctyloxy group, lauryloxy group and the like are mentioned, and preferable are a pentyloxy group, hexyloxy group, octyloxy group, 2-ethylhexyloxy group, decyloxy group and 3,7-dimethyloctyloxy group.

The alkylthio group may be any of linear, branched or cyclic, and has a carbon number of usually about 1 to 20, and as specific examples thereof, a methylthio group, ethylthio group, propylthio group, i-propylthio group, butylthio group, i-butylthio group, t-butylthio group, pentylthio group, hexylthio group, cyclohexylthio group, heptylthio group, octylthio group, 2-ethylhexylthio group, nonylthio group, decylthio group, 3,7-dimethyloctylthio group, laurylthio group and the like are mentioned, and preferable are a pentylthio group, hexylthio group, octylthio group, 2-ethylhexylthio group; decylthio group and 3,7-dimethyloctylthio group.

The alkylsilyl group may be any of linear, branched or cyclic, and has a carbon number of usually about 1 to 60, and as specific examples thereof, a methylsilyl group, ethylsilyl group, propylsilyl group, i-propylsilyl group, butylsilyl group, i-butylsilyl group, t-butylsilyl group, pentylsilyl group, hexylsilyl group, cyclohexylsilyl group, heptylsilyl group, octylsilyl group, 2-ethylhexylsilyl group, nonylsilyl group, decylsilyl group, 3,7-dimethyloctylsilyl group, laurylsilyl group, trimethylsilyl group, ethyldimethylsilyl group, propyldimethylsilyl group, i-propyldimethylsilyl group, butyldimethylsilyl group, t-butyldimethylsilyl group, pentyldimethylsilyl group, hexyldimethylsilyl group, heptyldimethylsilyl group, octyldimethylsilyl group, 2-ethylhexyldimethylsilyl group, nonyldimethylsilyl group, decyldimethylsilyl group, 3,7-dimethyloctyl-dimethylsilyl group, lauryldimethylsilyl group and the like are mentioned, and preferable are a pentylsilyl group, hexylsilyl group, octylsilyl group, 2-ethylhexylsilyl group, decylsilyl group, 3,7-dimethyloctylsilyl group, pentyldimethylsilyl group, hexyldimethylsilyl group, octyldimethylsilyl group, 2-ethylhexyl-dimethylsilyl group, decyldimethylsilyl group and 3,7-dimethyloctyl-dimethylsilyl group.

The alkylamino group may be any of linear, branched or cyclic and may be a monoalkylamino group or dialkylamino group, and has a carbon number of usually about 1 to 40, and specific examples thereof, a methylamino group, dimethylamino group, ethylamino group, diethylamino group, propylamino group, i-propylamino group, butylamino group, i-butylamino group, t-butylamino group, pentylamino group, hexylamino group, cyclohexylamino group, heptylamino group, octylamino group, 2-ethylhexylamino group, nonylamino group, decylamino group, 3,7-dimethyloctylamino group, laurylamino group and the like, and preferable are a pentylamino group, hexylamino group, octylamino group, 2-ethylhexylamino group, decylamino group and 3,7-dimethyloctylamino group.

The aryl group has a carbon number of usually about 6 to 60, and specific examples thereof, a phenyl group, $C_1$ to $C_{12}$ alkoxyphenyl groups ($C_1$ to $C_{12}$ means a carbon number of 1 to 12. Applicable also in the later descriptions), $C_1$ to $C_{12}$ alkylphenyl groups, 1-naphthyl group, 2-naphthyl group and the like are exemplified, and preferable are $C_1$ to $C_{12}$ alkoxyphenyl groups and $C_1$ to $C_{12}$ alkylphenyl groups.

The aryloxy group has a carbon number of usually about 6 to 60, and as specific examples thereof, a phenoxy group, $C_1$ to $C_{12}$ alkoxyphenoxy groups, $C_1$ to $C_{12}$ alkylphenoxy groups, 1-naphthyloxy group, 2-naphthyloxy group and the like are exemplified, and preferable are $C_1$ to $C_{12}$ alkoxyphenoxy groups and $C_1$ to $C_{12}$ alkylphenoxy groups.

The arylalkyl group has a carbon number of usually about 7 to 60, and as specific examples thereof, phenyl-$C_1$ to $C_{12}$ alkyl groups, $C_1$ to $C_{12}$ alkoxyphenyl-$C_1$ to $C_{12}$ alkyl groups, $C_1$ to $C_{12}$ alkylphenyl-$C_1$ to $C_{12}$ alkyl groups, 1-naphthyl-$C_1$ to $C_{12}$ alkyl groups, 2-naphthyl-$C_1$ to $C_{12}$ alkyl groups and the like are exemplified, and preferable are $C_1$ to $C_{12}$ alkoxyphenyl-$C_1$ to $C_{12}$ alkyl groups and $C_1$ to $C_{12}$ alkylphenyl-$C_1$ to $C_{12}$ alkyl groups.

The arylalkoxy group has a carbon number of usually about 7 to 60, and as specific examples thereof, phenyloxy-$C_1$ to $C_{12}$ alkoxy groups, $C_1$ to $C_{12}$ alkoxyphenyl-$C_1$ to $C_{12}$ alkoxy groups, $C_1$ to $C_{12}$ alkylphenyl-$C_1$ to $C_{12}$ alkoxy groups, 1-naphthyl-$C_1$ to $C_{12}$ alkoxy groups, 2-naphthyl-$C_1$ to $C_{12}$ alkoxy groups and the like are exemplified, and preferable are $C_1$ to $C_{12}$ alkoxyphenyl-$C_1$ to $C_{12}$ alkoxy groups and $C_1$ to $C_{12}$ alkylphenyl-$C_1$ to $C_{12}$ alkoxy groups.

The arylalkenyl group has a carbon number of usually about 8 to 60, and as specific examples thereof, phenyl-$C_2$ to $C_{12}$ alkenyl groups, $C_1$ to $C_{12}$ alkoxyphenyl-$C_2$ to $C_{12}$ alkenyl groups, $C_1$ to $C_{12}$ alkylphenyl-$C_2$ to $C_{12}$ alkenyl groups, 1-naphthyl-$C_2$ to $C_{12}$ alkenyl groups, 2-naphthyl-$C_2$ to $C_{12}$ alkenyl groups and the like are exemplified, and preferable are $C_1$ to $C_{12}$ alkoxyphenyl-$C_2$ to $C_{12}$ alkenyl groups and $C_1$ to $C_{12}$ alkylphenyl-$C_2$ to $C_{12}$ alkenyl groups.

The arylalkynyl group has a carbon number of usually about 8 to 60, and as specific examples thereof, phenyl-$C_2$ to $C_{12}$ alkynyl groups, $C_1$ to $C_{12}$ alkoxyphenyl-$C_2$ to $C_{12}$ alkynyl groups, $C_1$ to $C_{12}$ alkylphenyl-$C_2$ to $C_{12}$ alkynyl groups, 1-naphthyl-$C_2$ to $C_{12}$ alkynyl groups, 2-naphthyl-$C_2$ to $C_{12}$ alkynyl groups and the like are exemplified, and preferable are $C_1$ to $C_{12}$ alkoxyphenyl-$C_2$ to $C_{12}$ alkynyl groups and $C_1$ to $C_{12}$ alkylphenyl-$C_2$ to $C_{12}$ alkynyl groups.

The arylamino group has a carbon number of usually about 6 to 60, and a phenylamino group, diphenylamino group, $C_1$ to $C_{12}$ alkoxyphenylamino groups, di($C_1$ to $C_{12}$ alkoxyphenyl)amino groups, di($C_1$ to $C_{12}$ alkylphenyl)amino groups, 1-naphthylamino group, 2-naphthylamino group and the like are exemplified, and preferable are $C_1$ to $C_{12}$ alkylphenylamino groups and di($C_1$ to $C_{12}$ alkylphenyl)amino groups.

The monovalent heterocyclic group means an atom group remaining after removal of one hydrogen atom from a heterocyclic compound. The monovalent heterocyclic group has a carbon number of usually about 4 to 60, and specifically, a thienyl group, $C_1$ to $C_{12}$ alkylthienyl groups, pyrrolyl group, furyl group, pyridyl group, $C_1$ to $C_{12}$ alkylpyridyl groups and the like are exemplified, and preferable are a thienyl group, $C_1$ to $C_{12}$ alkylthienyl groups, pyridyl group and $C_1$ to $C_{12}$ alkylpyridyl groups.

When the above-mentioned substituent contains an alkyl chain, this alkyl chain may be interrupted by a hetero atom or a group containing a hetero atom. Here, exemplified as the hetero atom are an oxygen atom, sulfur atom, nitrogen atom and the like. As the hetero atom or group containing a hetero atom, for example, the following groups are mentioned.

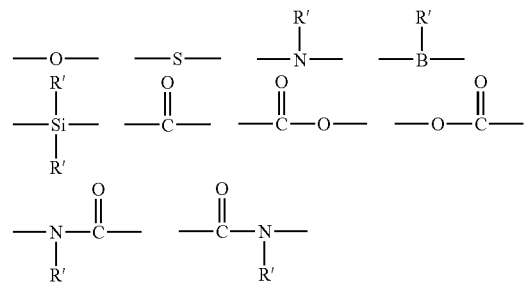

Here, examples of R' include a hydrogen atom, alkyl groups having 1 to 20 carbon atoms, aryl groups having 6 to 60 carbon atoms and monovalent heterocyclic groups having 4 to 60 carbon atoms.

The divalent heterocyclic group means an atomic group in which two hydrogen atoms are removed from a heterocyclic compound, and the number of carbon atoms is usually about 4 to 60. The number of carbon atoms does not include the number of carbon atoms of substituents.

The heterocyclic compound means an organic compound having a cyclic structure in which at least one heteroatom such as oxygen, sulfur, nitrogen, phosphorus, boron, etc. is contained in the cyclic structure as the element other than carbon atoms.

Examples of the divalent heterocyclic groups include the followings.

Groups containing nitrogen as a hetero atom; pyridine-diyl group (following formulas 39-44), diazaphenylene group (following formulas 45-48), quinolinediyl group (following formulas 49-63), quinoxalinediyl group (following formulas 64-68), acridinediyl group (following formulas 69-72), bipyridyldiyl group (following formulas 73-75), phenanthrolinediyl group (following formulas 76-78), etc.

Groups having a fluorene structure containing silicon, nitrogen, oxygen, sulfur, selenium, etc. as a hetero atom (following formulas 79-93).

5 membered heterocyclic groups containing silicon, nitrogen, oxygen, sulfur, selenium, etc. as a hetero atom: (following formulas 94-98).

Condensed 5 membered heterocyclic groups containing silicon, nitrogen, oxygen, sulfur, selenium, etc. as a hetero atom: (following formulas 99-108), 5 membered heterocyclic groups containing sulfur, etc. as a hetero atom, which are connected at the a position of the hetero atom to form a dimer or an oligomer (following formulas 109-110); and 5 membered ring heterocyclic groups containing silicon, nitrogen, oxygen, sulfur, selenium, as a hetero atom is connected with a phenyl group at the a position of the hetero atom (following formulas 111-117).

39

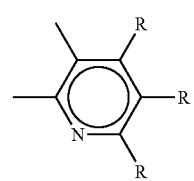

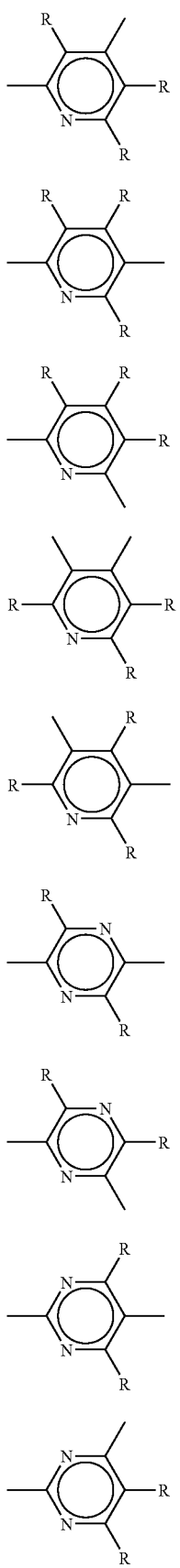
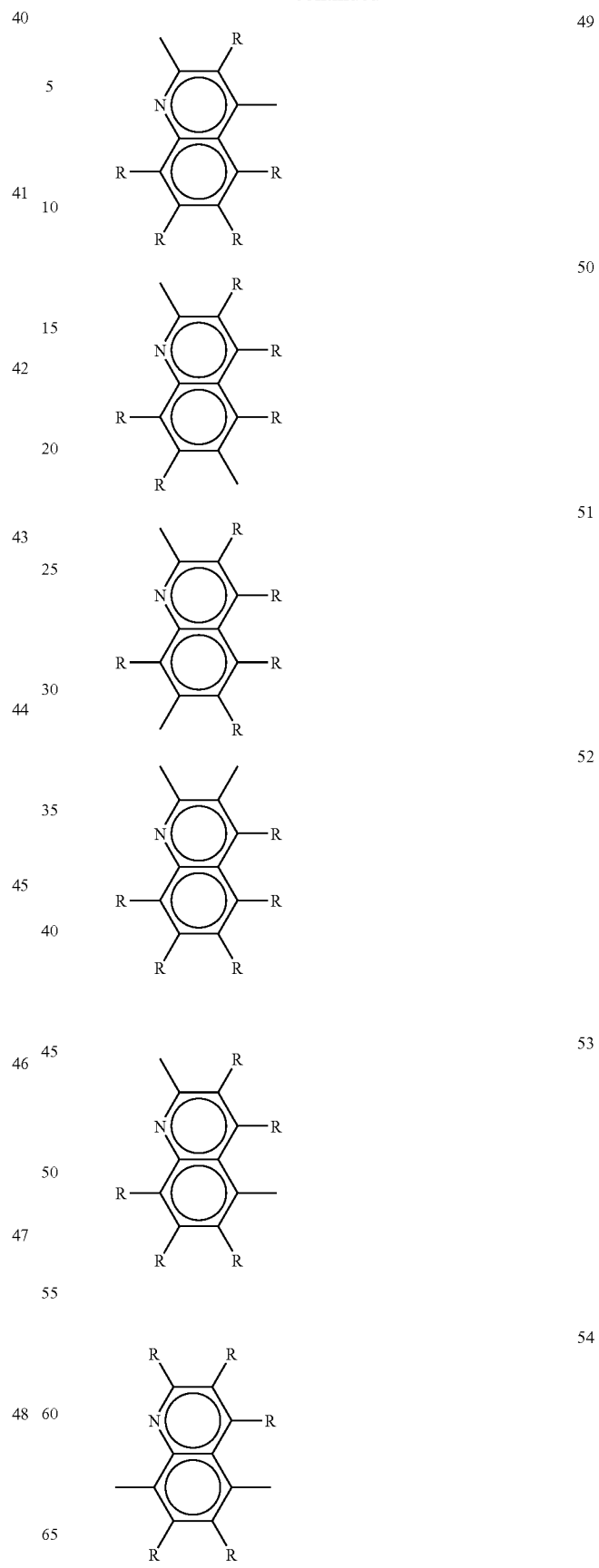

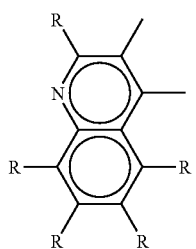 55
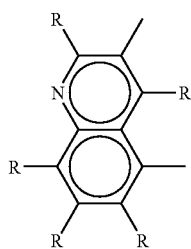 56
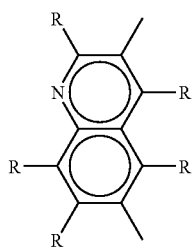 57
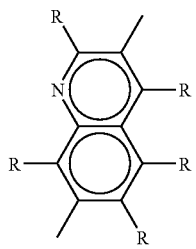 58
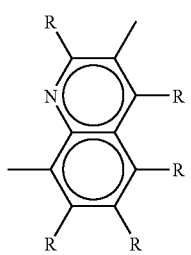 59
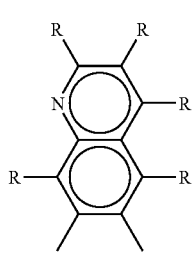 60
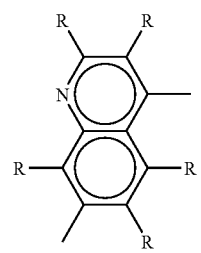 61
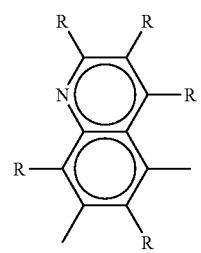 62
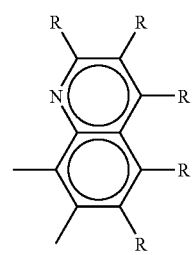 63
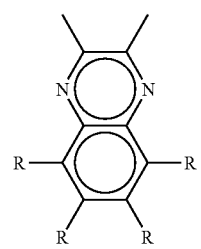 64
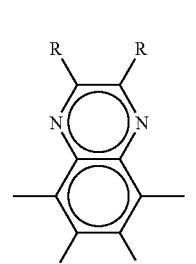 65
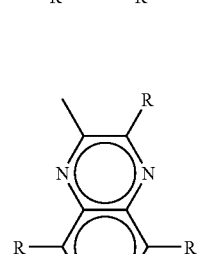 66

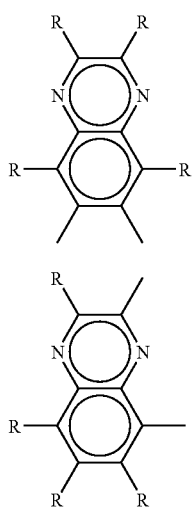
67
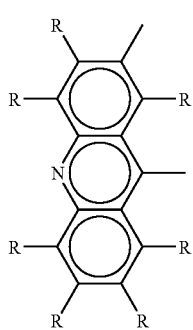
68
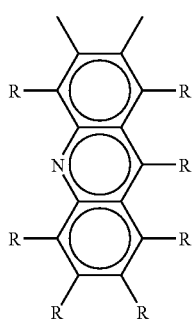
69
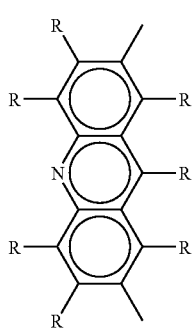
70
71
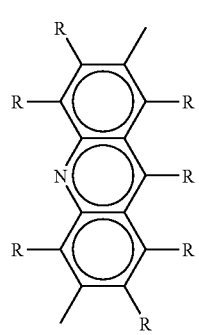
72
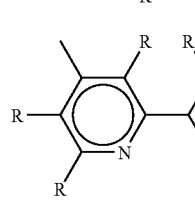
73
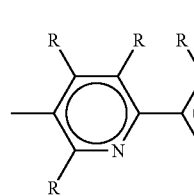
74
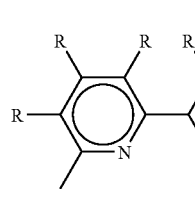
75
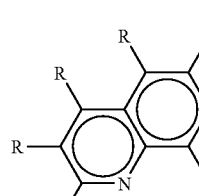
76
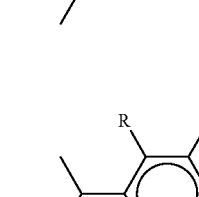
77
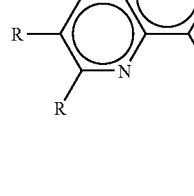
78
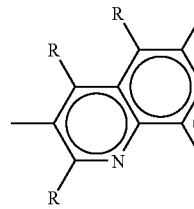

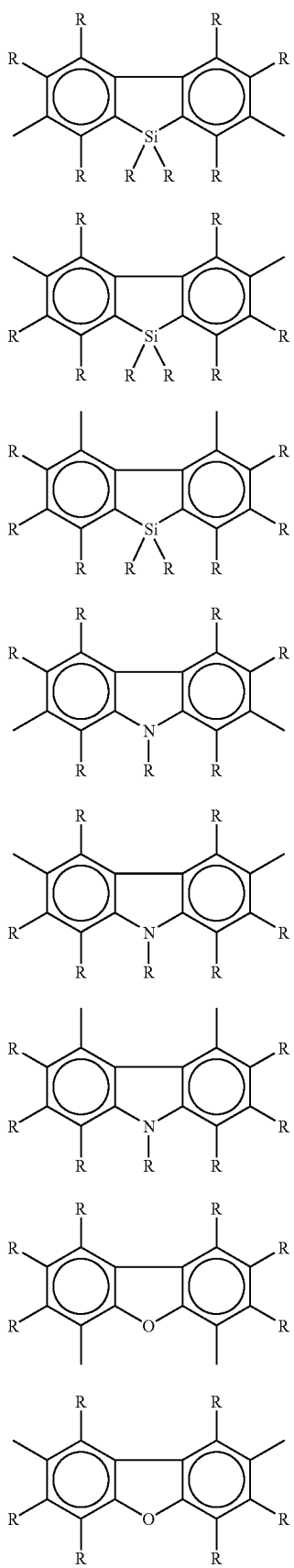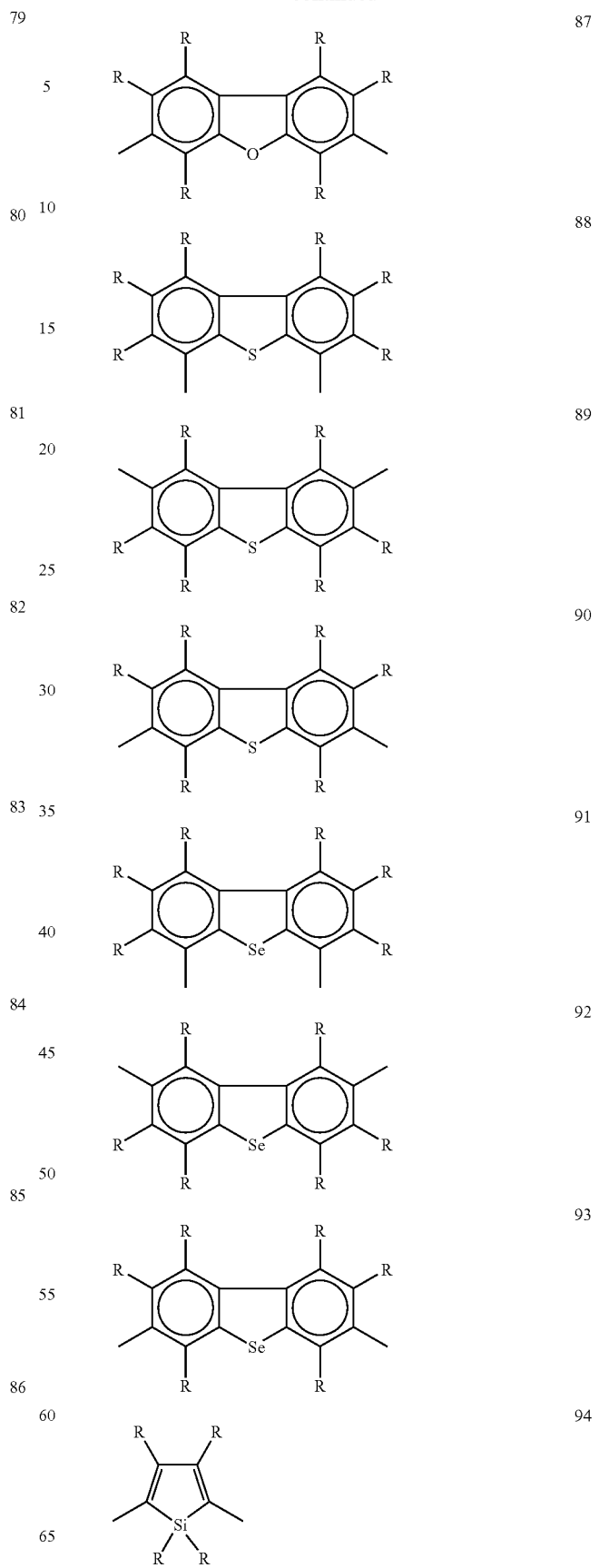

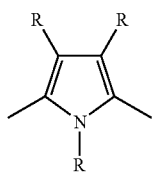
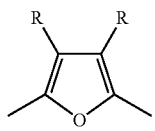
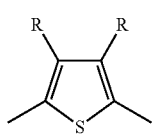
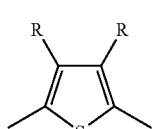
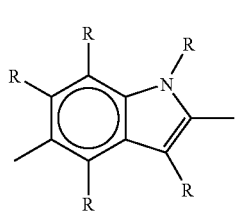
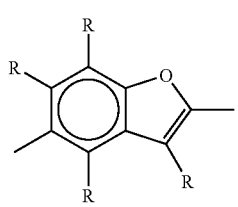
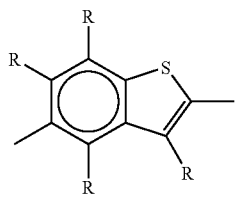
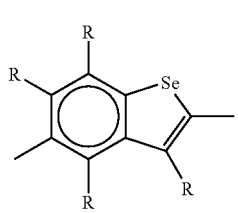
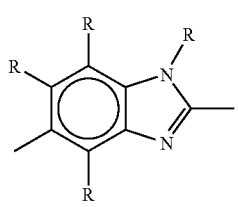
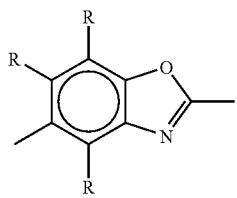
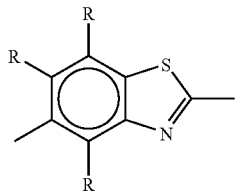
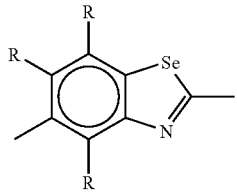
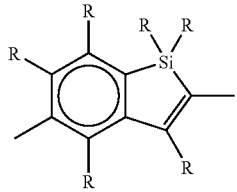
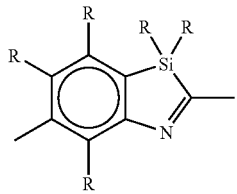
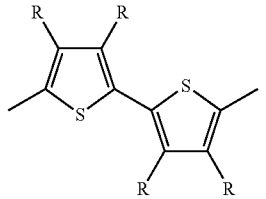
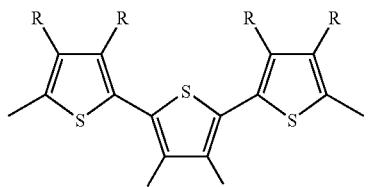
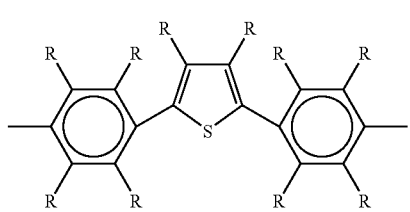

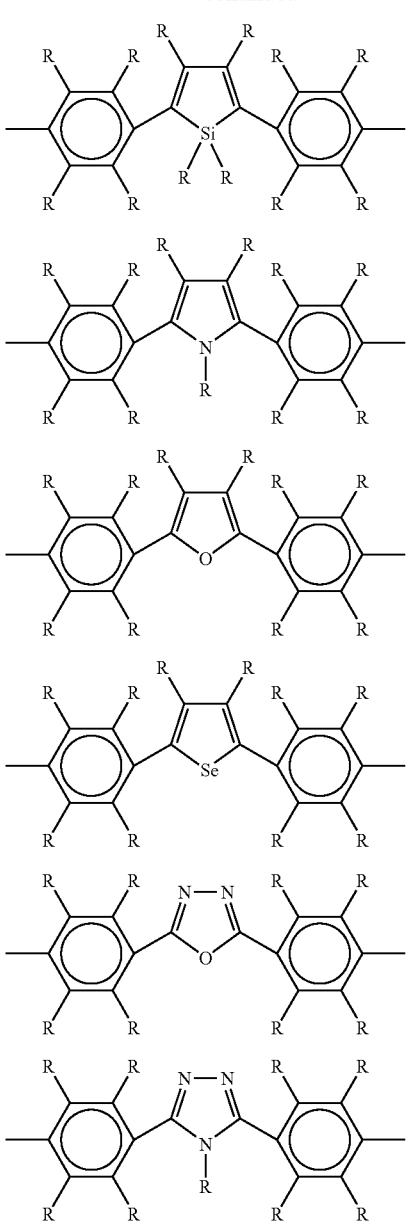

In the above-described formulae 39 to 117, R represents the same meaning as described above.

The divalent aromatic amine group means an atom group remaining after removal of two hydrogen atoms from an aromatic amine, and has a carbon number of usually about 4 to 60, and the carbon number does not include the number of carbon atoms in a substituent. As the divalent aromatic amine group, for example, groups of the following general formula (5) are mentioned.

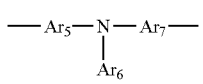 (5)

In the formula, $Ar_5$ and $Ar_7$ represent each independently an arylene group optionally having a substituent, a group of the general formula (6) or a group of the general formula (7). $Ar_5$ represents an arylene group optionally having a substituent, a group of the general formula (8) or a group of the general formula (9). A ring may be formed between $Ar_5$ and $Ar_6$, between $Ar_5$ and $Ar_7$, or between $Ar_6$ and $Ar_7$.

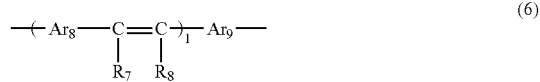 (6)

In the formula, $Ar_8$ and $Ar_9$ represent each independently an arylene group optionally having a substituent. $R_7$ and $R_8$ represent each independently a hydrogen atom, alkyl group, aryl group, monovalent heterocyclic group or cyano group. l is 0 or 1.

 (7)

In the formula, $Ar_{10}$ and $Ar_{11}$ represent each independently an arylene group optionally having a substituent. $Ar_{12}$ is an aryl group optionally having a substituent. A ring may be formed between $Ar_{10}$ and $Ar_{12}$, between $Ar_{10}$ and $Ar_{11}$, or between $Ar_{11}$ and $Ar_{12}$.

 (8)

In the formula, $Ar_{13}$ represents an arylene group optionally having a substituent. $Ar_{16}$ and $Ar_{17}$ represent each independently an aryl group optionally having a substituent. A ring may be formed between $Ar_{13}$ and $Ar_{16}$, between $Ar_{13}$ and $Ar_{17}$, or between $Ar_{16}$ and $Ar_{17}$

 (9)

In the formula, $Ar_{14}$ represents an arylene group optionally having a substituent. $Ar_{15}$ represents an aryl group optionally having a substituent. $R_{11}$ and $R_{12}$ represent each independently a hydrogen atom, alkyl group, aryl group, monovalent heterocyclic group or cyano group. r is 0 or 1.

$Ar_5$, $Ar_7$ in the above-described formula (5), $Ar_8$, $Ar_9$ in the above-described formula (6), $Ar_{10}$, $Ar_{11}$ in the above-described formula (7), $Ar_{13}$ in the above-described formula (8) and $Ar_{14}$ in the above-described formula (9) may have a substituent such as an alkyl group, alkoxy group, alkylthio group, alkylsilyl group, alkylamino group, aryl group, aryloxy group, arylalkyl group, arylalkoxy group, arylalkenyl group, arylalkynyl group, arylamino group, monovalent heterocyclic group, cyano group or the like.

$Ar_6$ in the above-described formula (5), $Ar_{12}$ in the above-described formula (7), $Ar_{16}$, $Ar_{17}$ in the above-described formula (8) and $Ar_{15}$ in the above-described formula (9) may have a substituent such as an alkyl group, alkoxy group, alkylthio group, alkylsilyl group, alkylamino group, aryl group, aryloxy group, arylalkyl group, arylalkoxy group, arylalkenyl group, arylalkynyl group, arylamino group, monovalent heterocyclic group, cyano group or the like.

As the divalent aromatic amine group, specifically, the following groups are exemplified.

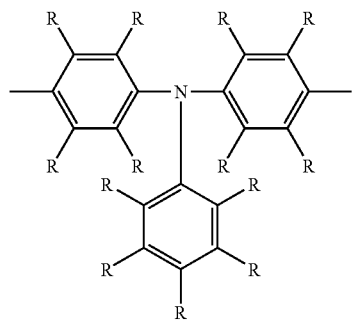

118

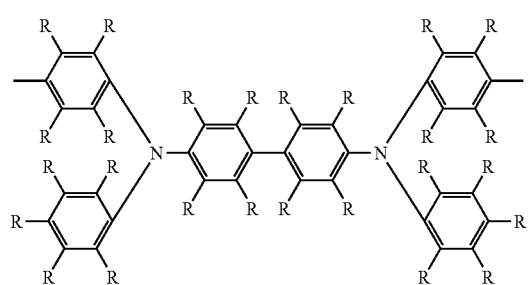

119

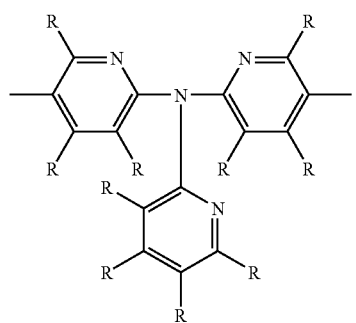

120

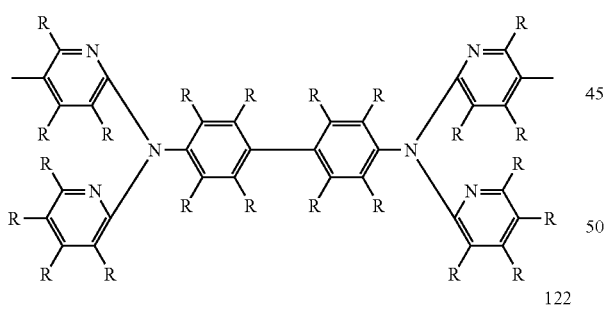

121

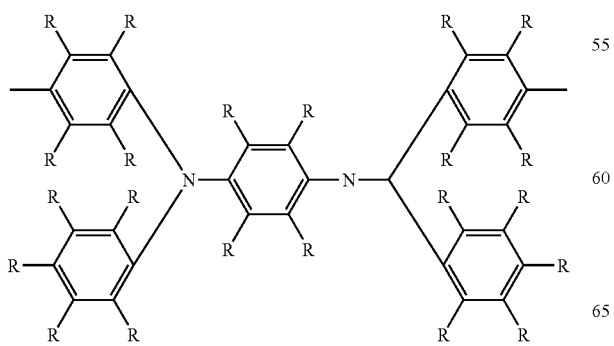

122

In the above-described formulae 118 to 122, R represents the same meaning as described above.

Here, for enhancing solubility of a polymer compound of the present invention in solvents, it is preferable that the shape of a repeating unit has little symmetry, and it is preferable that a cyclic or branched alkyl chain is contained in one or more Rs. A plurality of Rs may be coupled to form a ring.

Substituents containing an alkyl chain, among groups represented by R, may be any of linear, branched or cyclic or a combination thereof. In the case of non-linear, exemplified are an isoamyl group, 2-ethylhexyl group, 3,7-dimethyloctyl group, cyclohexyl group, 4-$C_1$ to $C_{12}$ alkylcyclohexyl groups and the like.

The divalent group having a metal complex structure means a divalent group remaining after removal of two hydrogen atoms from an organic ligand of a metal complex having an organic ligand.

The carbon number of the organic ligand is usually about 4 to 60, and examples thereof include 8-quinolinol and derivatives thereof, benzoquinolinol and derivatives thereof, 2-phenyl-pyridine and derivatives thereof, 2-phenyl-benzothiazole and derivatives thereof, 2-phenyl-benzoxazole and derivatives thereof, porphyrin and derivatives thereof, and the like.

Mentioned as the center metal of the complex are, for example, aluminum, zinc, beryllium, iridium, platinum, gold, europium, terbium and the like.

As the metal complex having an organic ligand, mentioned are metal complexes, triplet light emitting complexes and the like known as fluorescent materials and phosphorescent materials of lower molecular weight.

As the divalent group having a metal complex structure, the following groups 126 to 132 are specifically exemplified.

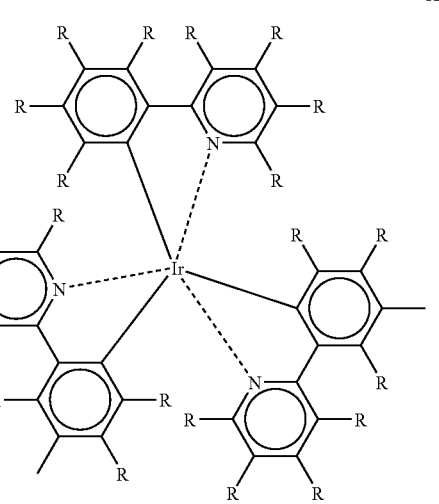

126

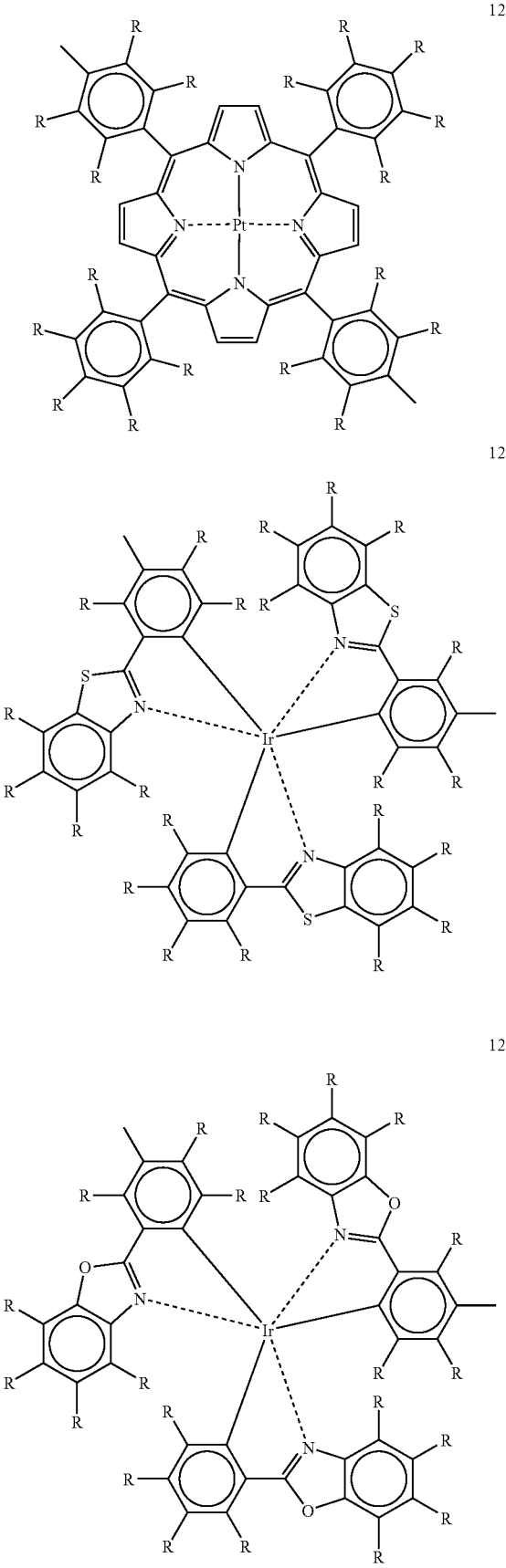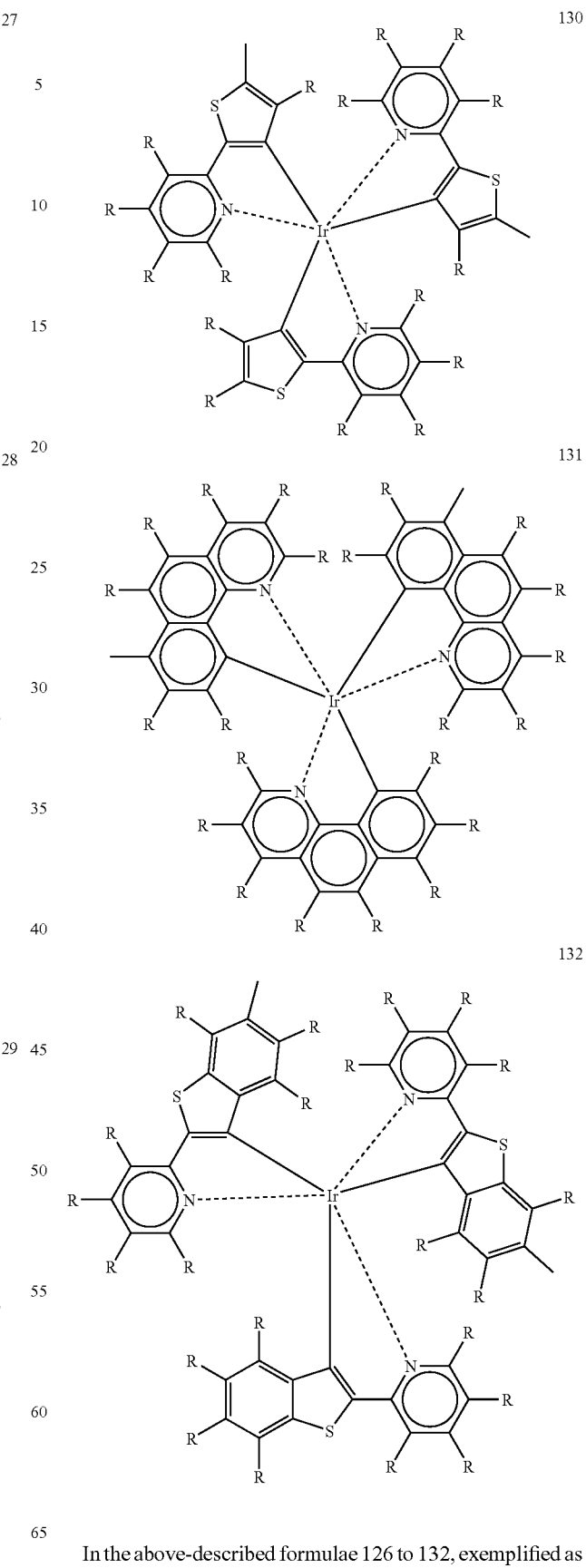
In the above-described formulae 126 to 132, exemplified as R are the same groups as described above.

Among polymer compounds of the present invention, those containing a repeating unit of the above-mentioned formula (2) are preferable from the standpoint of change of light emitting wavelength.

From the standpoint of easiness of control of light emitting wavelength, easiness of control of molecular weight and easiness of synthesis, a polymer compound composed of a repeating unit of the above-described formula (2) wherein m is 0 is preferable.

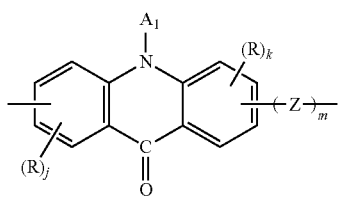

(2)

Z represents —$CR_3$=$CR_4$— or —C≡C—. $R_3$ and $R_4$ represent each independently a hydrogen atom, alkyl group, aryl group, monovalent heterocyclic group or cyano group. m represents 0 or 1. It is preferable that m is 0 from the standpoint of photooxidation stability. $A_1$ and R represent the same meanings as described above. j and k represent each independently an integer of 0 to 3. From the standpoint of easiness of synthesis, 0 is preferable and from the standpoint of solubility, light emitting efficiency and the like, 1 to 3 are preferable.

Specific examples of the repeating unit of the formula (2) are shown below.

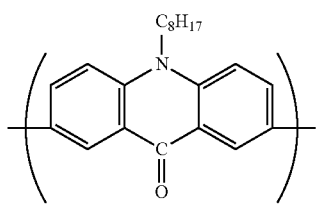

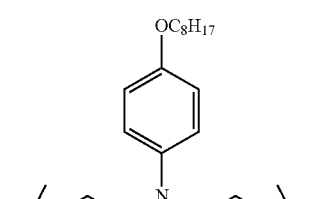

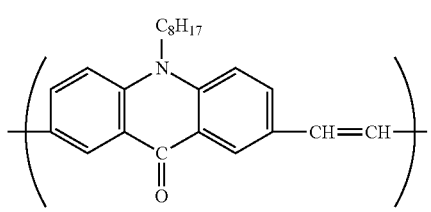

-continued

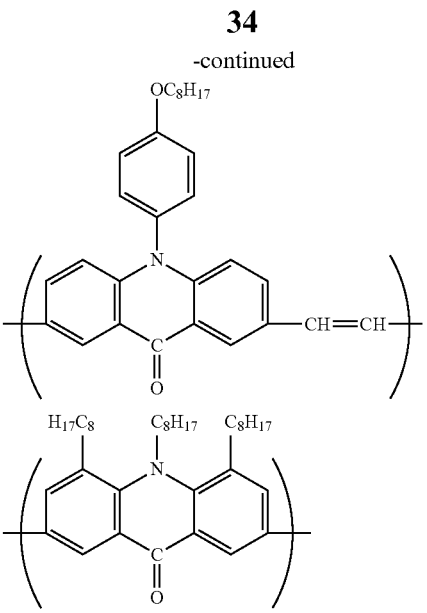

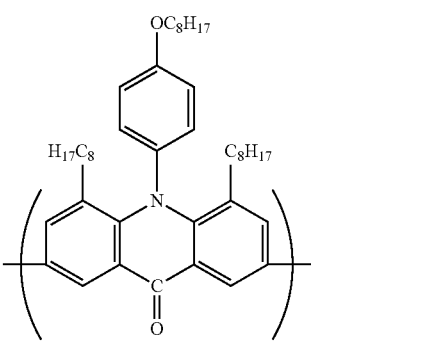

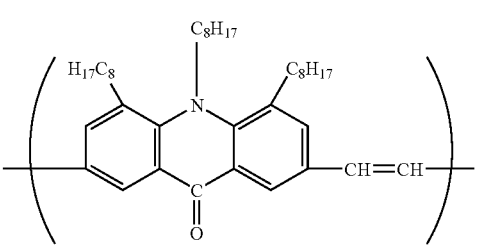

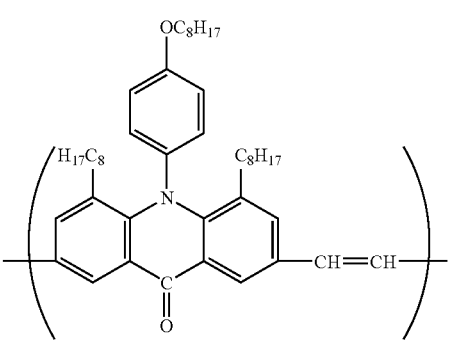

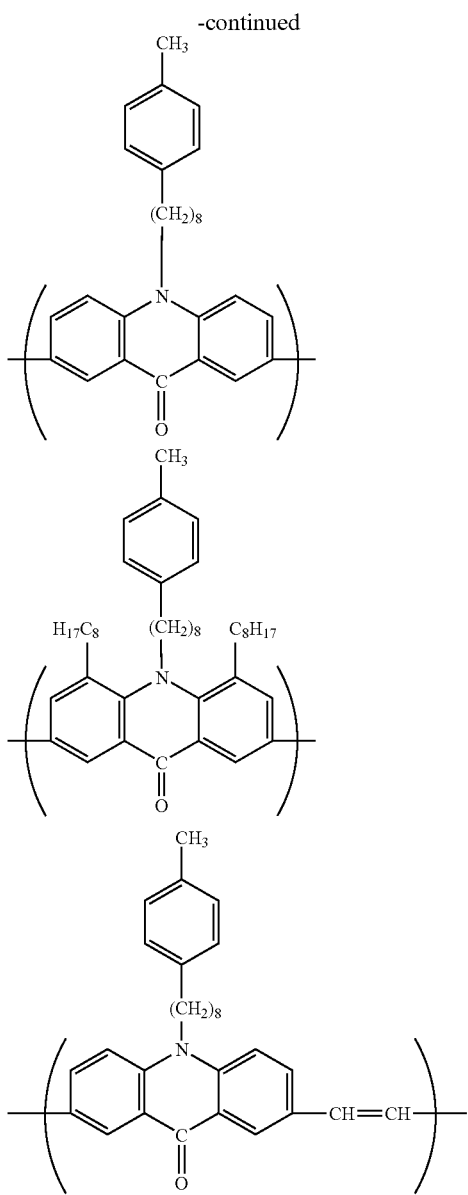

Among polymer compounds of the present invention, preferable are those containing further a repeating unit of the following formula (30) from the standpoint of enhancement of light emitting efficiency and change of light emitting wavelength.

—Ar$_1$—(Z')p-  (30)

Ar$_1$ in the above-described formula (30) is an arylene group, divalent heterocyclic group or divalent aromatic amine group. The arylene group, divalent heterocyclic group and divalent aromatic amine group represented by Ar$_1$ are the same groups as described and exemplified for the above-mentioned Ar.

In the above-described formula (30), Z' represents —CR$_5$=CR$_6$— or —C≡C—. R$_5$ and R$_6$ represent each independently a hydrogen atom, alkyl group, aryl group, monovalent heterocyclic group or cyano group. p represents 0 or 1. —CR$_5$=CR$_6$— is preferable from the standpoint of stability. —CR$_5$=CR$_6$— is preferable from the standpoint of elongation of light emitting wavelength. From the standpoint of photooxidation stability, it is more preferable that p is 0.

The total amount of repeating units of the above-described formula (2) is 0.1 mol % or more and 100 mol % or less, preferably 1 mol % or more and 100 mol % or less based on all repeating units.

Among polymer compounds containing repeating units of the formulae (2) and (30), those in which the total amount of repeating units of the formulae (2) and (30) is 50 mol % or more based on all repeating units are more preferable from the standpoint of light emitting efficiency. Additionally, those in which the amount of a repeating unit of the formula (2) is 0.1 mol % or more and 90 mol % or less based on the total amount of repeating units of the formulae (2) and (30) are more preferable from the standpoint of light emitting efficiency.

Substantially, preferable as those composed of repeating units of the formulae (2) and (30) are specifically copolymers composed of one more groups selected from the following examples as the repeating unit of the formula (2):

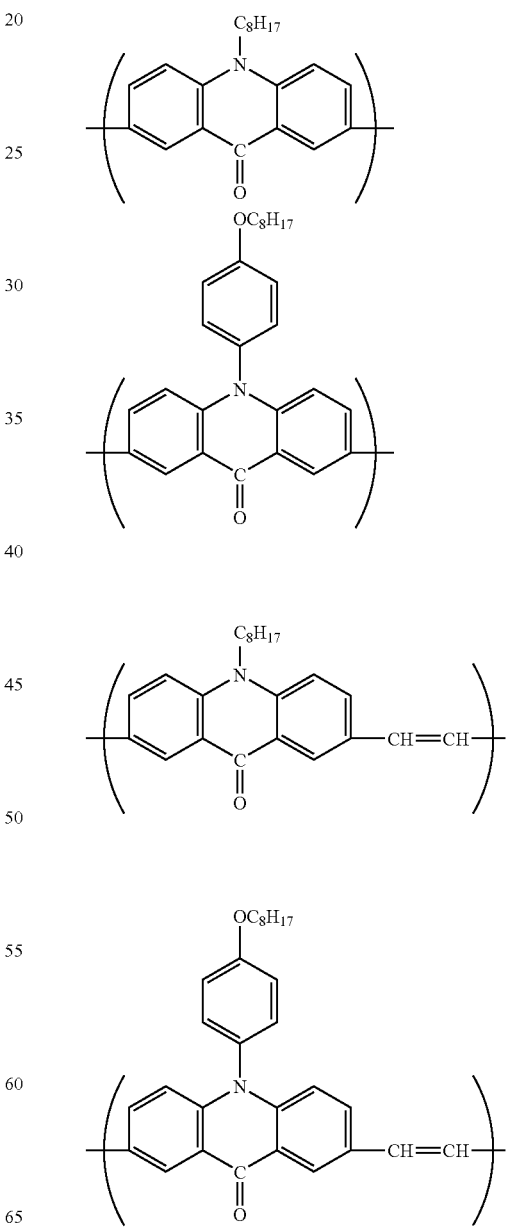

and one or more groups selected from the following examples as the repeating unit of the formula (30):
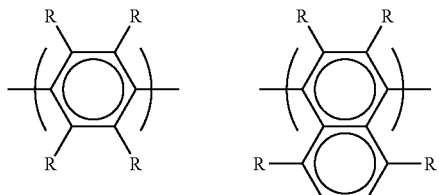
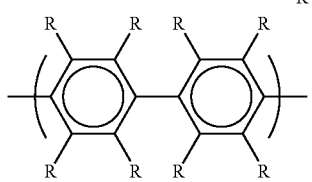
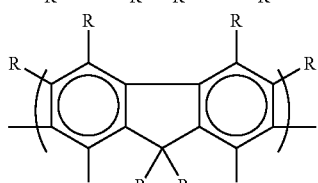
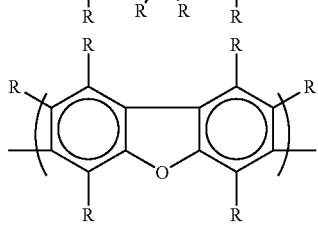
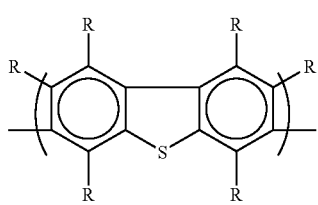
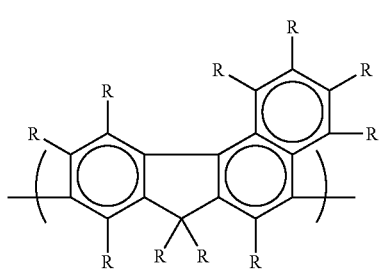
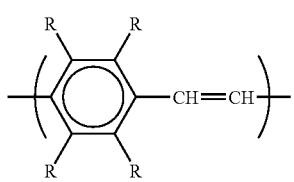
-continued
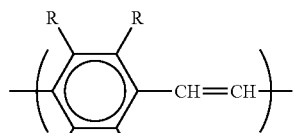
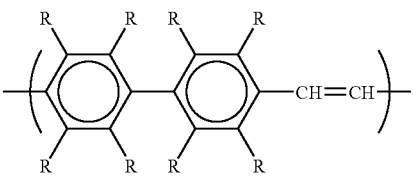
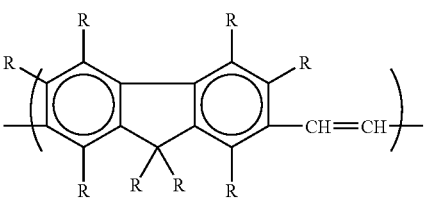
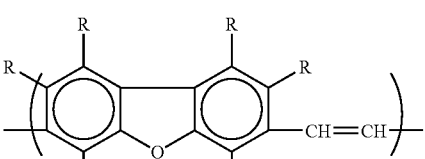
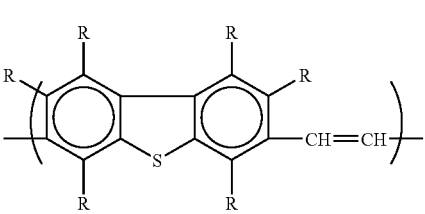
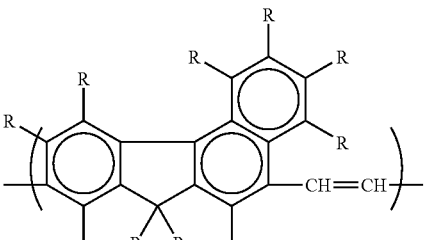
(wherein, R represents the same meaning as described above).
Among polymer compounds of the present invention, those containing a repeating unit of the following formula (3) are preferable from the standpoint of light emitting efficiency.

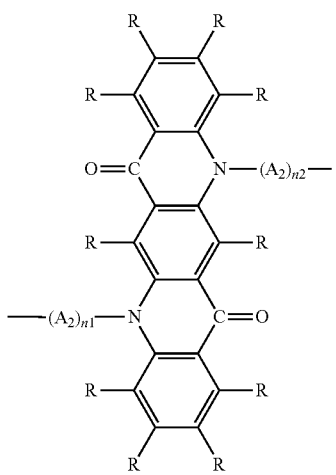

(3)

(wherein, $A_2$ represents a group of the following formula (4):

*-$(Ar_1)j_1$-$(X)k_1$-$(Ar_2)p_1$-$(Y)q_1$-   (4)

(wherein, $Ar_1$ and $Ar_2$ represent each independently an arylene group, divalent heterocyclic group or divalent aromatic amine group, X represents —$R_7$—, —O—$R_7$—, —$R_7$—O—, —$R_7$—C(O)O—, —$R_7$—OC(O)—, —$R_7$—N($R_{20}$)—, —O—, —S—, —C(O)O— or —C(O)—, Y represents —C($R_{20}$)=C($R_{20}$)— or —C≡C—, $j_1$, $k_1$, $p_1$ and $q_1$ are each independently 0 or 1, $R_7$ represents an alkylene group, $R_{20}$ represents a hydrogen atom, alkyl group, aryl group, monovalent heterocyclic group or cyano group, and * represents a site to be connected to N.), $n_1$ and $n_2$ represent each independently 0 or 1, and R is as described above, and a plurality of Rs may be the same or different).

$A_2$ in the above-described formula (3) is a group of the above-described formula (4).

$Ar_1$ and $Ar_2$ in the above-described formula (4) represent each independently an arylene group, divalent heterocyclic group or divalent aromatic amine group. Here, $Ar_1$ and $Ar_2$ may have a substituent such as an alkyl group, alkoxy group, alkylthio group, alkylsilyl group, alkylamino group, aryl group, aryloxy group, arylalkyl group, arylalkoxy group, arylalkenyl group, arylalkynyl group, arylamino group, monovalent heterocyclic group or the like. When $Ar_1$ and $Ar_2$ have a plurality of substituents, these substituents may be the same or different.

In the above-described formula (4), the arylene group means an atom group remaining after removal of two hydrogen atoms from an aromatic hydrocarbon, and has a carbon number of usually about 6 to 60. The carbon number does not include the number of carbon atoms in a substituent. Also included as the aromatic hydrocarbon here are those having a condensed ring, and those in which two or more independent benzene rings or condensed rings are connected directly or via a group such as a vinylene group and the like. As specific examples of the arylene group, the formulae 1 to 38 and A to K as illustrated above are mentioned. The divalent heterocyclic group is the same as described for the above-mentioned formula (1), and as specific examples thereof, the formulae 39 to 117 as illustrated above are mentioned. The divalent aromatic amine group is the same as described for the above-mentioned formula (1), and as specific examples thereof, the formulae 118 to 122 as illustrated above are mentioned.

In the above-described formula (4), X represents —$R_7$—, —O—$R_7$—, —$R_7$—O—, —$R_7$—C(O)O—, —$R_7$—OC(O)—, —$R_7$—N($R_{20}$)—, —O—, —S—, —C(O)O— or —C(O)—. $R_7$ represents an alkylene group. From the standpoint of solubility and easiness of synthesis, —$R_7$— and —$R_7$—O— are preferable.

In the above-described formula (4), Y represents —C($R_{20}$)=C($R_{20}$)— or —C≡C—. $R_{20}$ represents a hydrogen atom, alkyl group, aryl group, monovalent heterocyclic group or cyano group. —C($R_{20}$)=C($R_{20}$)— is preferable from the standpoint of stability.

In the above-described formula (4), $j_1$, $k_1$, $p_1$ and $q_1$ represent each independently 0 or 1. From the standpoint of light emitting efficiency, solubility and easiness of synthesis, it is preferable that $q_1$ is 0, $k_1$ is 1 and X is —$R_7$— or —$R_7$—O—. It is more preferable that $q_1$ is 0, $p_1$ is 1, $Ar_2$ is phenylene and X is —$R_7$— or —$R_7$—O—. Further, from the standpoint of stability, $q_1$ is preferably 0.

In the above-described formula (3), $n_1$ and $n_2$ represent each independently 0 or 1. From the standpoint of light emitting efficiency, solubility and easiness of synthesis, at least one of $n_1$ and $n_2$ is 1. It is more preferable that $n_1$ and $n_2$ both represent 1.

The total amount of repeating units of the formula (3) is preferably 0.1 mol % or more and 100 mol % or less based on all repeating units.

From the standpoint of change of light emitting wavelength, preferable are polymer compounds composed of a repeating unit of the above-described formula (3) wherein $n_1$ and $n_2$ both represent 0.

Among polymer compounds of the present invention, also preferable are those containing further a repeating unit of the following formula (31) from the standpoint of enhancement of light emitting efficiency and change of light emitting wavelength.

—$Ar_4$—$(Z)_t$-   (31)

(wherein, $Ar_4$ represents an arylene group, divalent heterocyclic group or divalent aromatic amine group. Z represents —$CR_8$=$CR_9$— or —C≡C—. $R_8$ and $R_9$ represent each independently a hydrogen atom, alkyl group, aryl group, monovalent heterocyclic group or cyano group. t represents 0 or 1).

As the repeating unit of the formula (31), specifically mentioned are those having structures described in the above-mentioned formulae 1 to 117, the above-mentioned formulae A to I and K, the above-mentioned formulae 118 to 122, and formulae 133 to 140 described later. Among others, preferable are phenylene groups (e.g., formulae 1 to 3 as illustrated above), naphthalenediyl groups (formulae 4 to 13 as illustrated above), anthracenylene groups (formulae 14 to 19 as illustrated above), biphenylene groups (formulae 20 to 25 as illustrated above), triphenylene groups (formulae 26 to 28 as illustrated above), confused ring compound groups (formulae 29 to 38 as illustrated above), dibenzofuran-diyl groups (formulae 85 to 87 as illustrated above), dibenzothiophene-diyl groups (formulae 88 to 90 as illustrated above), stilbene-diyl groups (A to D as illustrated above), distilbene-diyl groups (E, F as illustrated above), benzofluorene-diyl groups (G, H, I, K as illustrated above), divalent aromatic amine groups (formulae 118 to 119 and 122 as illustrated above), arylenevinylene groups (formulae 133 to 140 as illustrated below) and the like, and particularly, phenylene groups, biphenylene groups, fluorene-diyl groups (formulae 36 to 38 as illustrated above), dibenzofuran-diyl groups (formulae 85 to 87 as illustrated above), dibenzothiophene-diyl groups (formulae 88 to 90 as illustrated above), stilbene-diyl groups (A to D as illustrated above), distilbene-diyl groups (E, F as illustrated above), benzofluorene-diyl groups (G, H, I, K as illustrated above) and divalent aromatic amine groups are preferable.

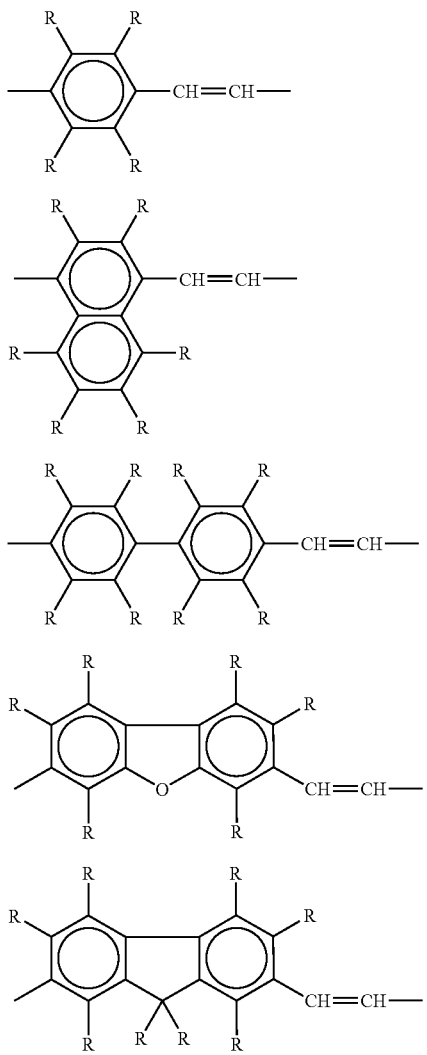

133

134

135

136

137

-continued

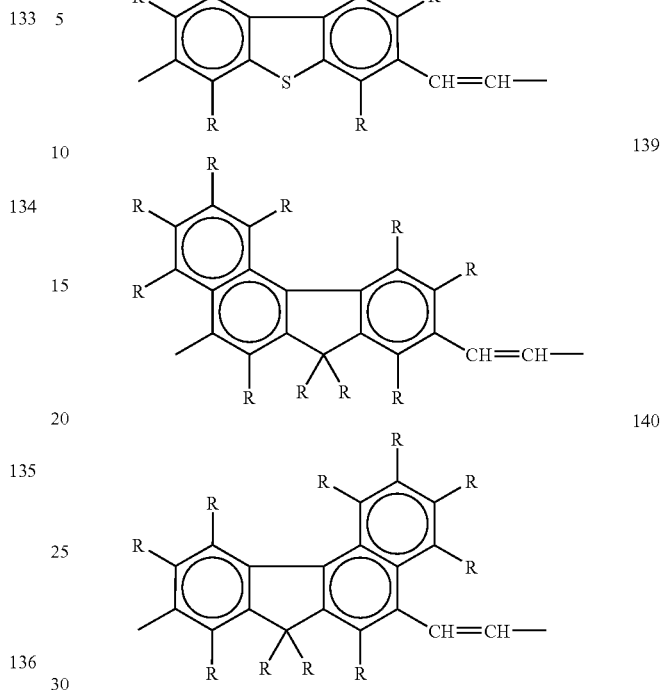

138

139

140

Here, R represents the same meaning as described above.

For enhancing solubility of a polymer compound of the present invention in solvents, it is preferable that the shape of a repeating unit has little symmetry, and it is preferable that a cyclic or branched alkyl chain is contained in one or more Rs. A plurality of Rs may be coupled to form a ring. Substituents containing an alkyl chain, among groups represented by R, may be any of linear, branched or cyclic or a combination thereof. In the case of non-linear, exemplified are an isoamyl group, 2-ethylhexyl group, 3,7-dimethyloctyl group, cyclohexyl group, 4-$C_1$ to $C_{12}$ alkylcyclohexyl groups and the like.

Substantially, exemplified as those composed of repeating units of the formulae (3) and (31) are specifically copolymers composed of one more groups selected from the following examples as the repeating unit of the formula (3):

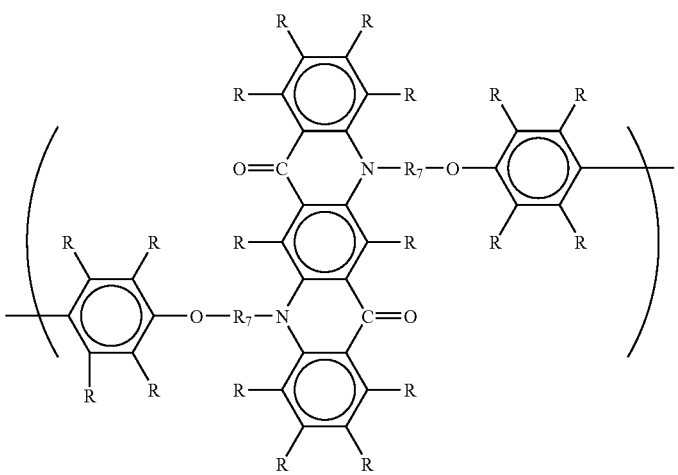

-continued
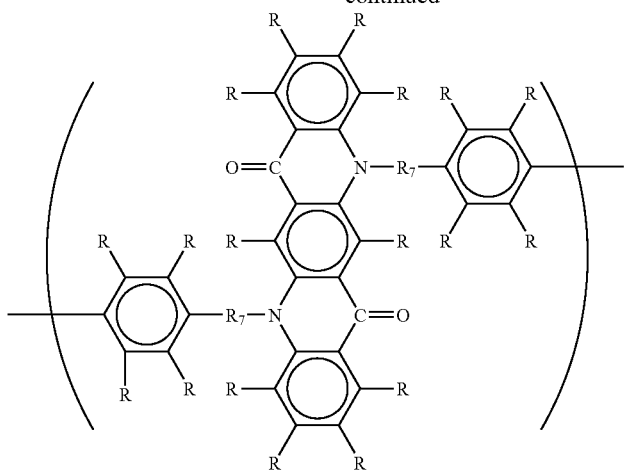
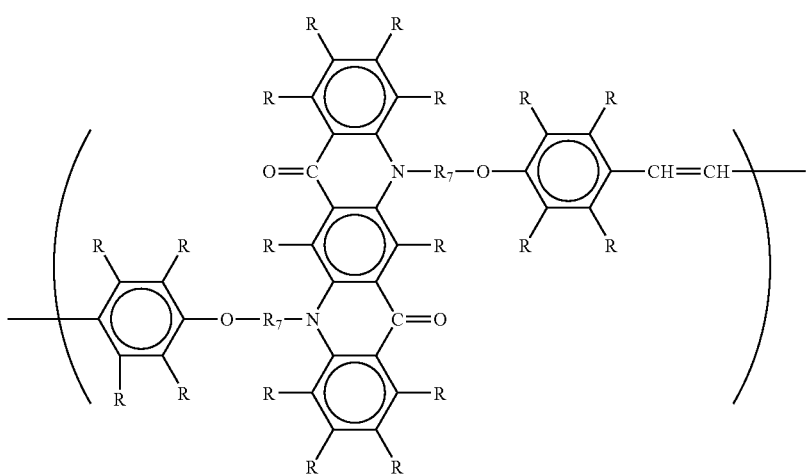
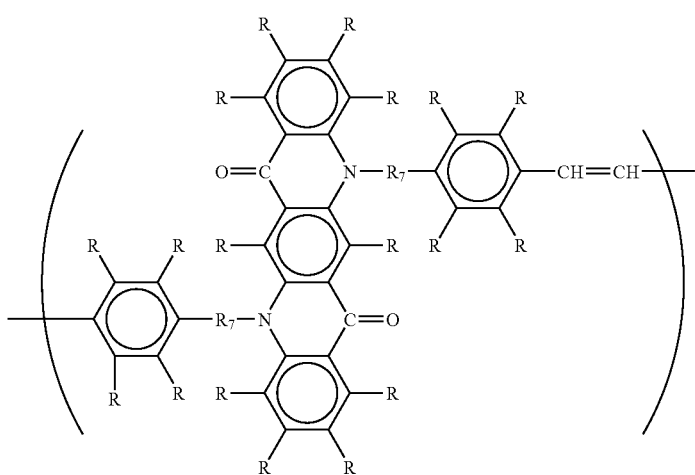

(wherein, R and $R_7$ represent the same meanings as described above.) and one or more groups selected from the following examples as the repeating unit of the formula (31):

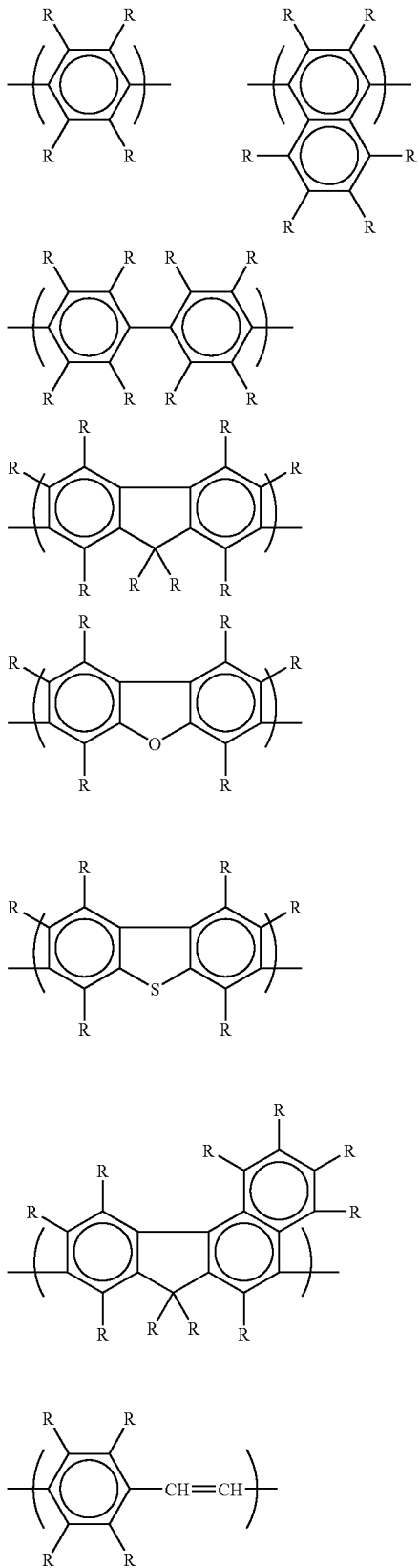

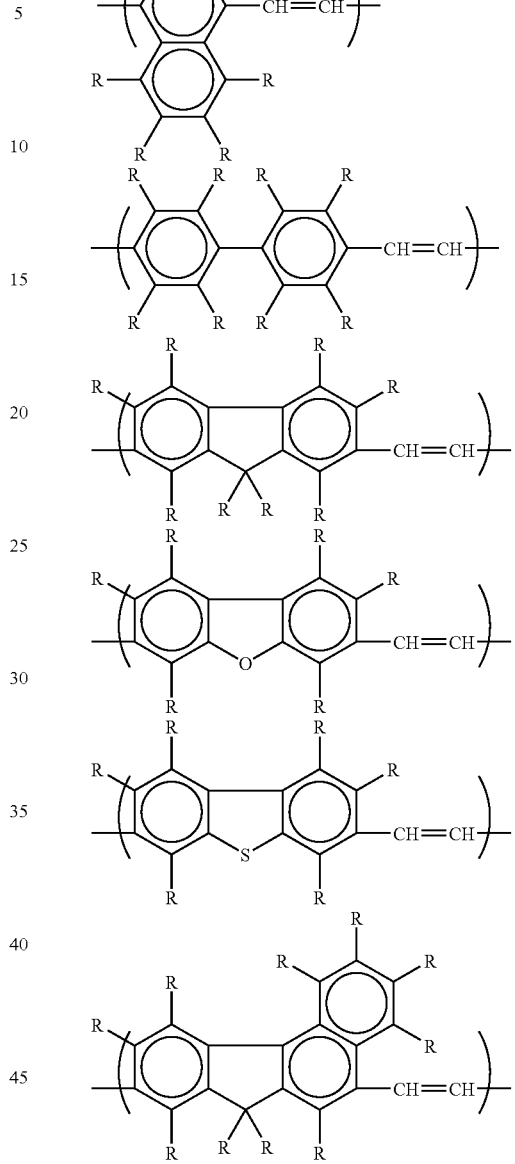

(wherein, R represents the same meaning as described above).

Among polymer compounds containing repeating units of the formulae (3) and (31), those in which the total amount of repeating units of the formulae (3) and (31) is 50 mol % or more based on all repeating units are more preferable from the standpoint of light emitting efficiency. Additionally, those in which the amount of a repeating unit of the formula (3) is 0.1 mol % or more and 90 mol % or less based on the total amount of repeating units of the formulae (3) and (31) are more preferable from the standpoint of light emitting efficiency.

The polymer compound of the present invention has a polystyrene reduced number average molecular weight of typically $10^3$ to $10^8$, preferably $2 \times 10^3$ to $10^7$.

When a polymerization active group remains intact at an end group of a polymer compound of the present invention, there is a possibility of lowering of light emitting property and life when made into a device, thus, the end group may be protected by a stable group. Those having a conjugated bond consecutive to a conjugation structure of the main chain are preferable, and for example, structures connected to an aryl group or heterocyclic group via a vinylene group may be permissible. Specifically, substituents described in chemical formula 10 of Japanese Patent Application Laid-Open (JP-A) No. 9-45478 and the like are exemplified.

The polymer compound of the present invention may contain repeating units other than the repeating units of the above-described formulae (3) and (31) in a range not deteriorating fluorescent property and charge transporting property, however, those composed substantially of a repeating unit of the formula (1) and those composed substantially of repeating units of the formulae (3) and (31) are preferable.

Repeating units may be connected via a vinylene or nonconjugated portion, or repeating units may contain a vinylene or nonconjugated portion. As the connected structure containing a nonconjugated portion, exemplified are those shown later, combinations of those shown later with a vinylene group, and combinations of two or more of those shown below, and the like. Here, R represents a group selected from the same substituents as described above, and Ar' represents a hydrocarbon group having 6 to 60 carbon atoms.

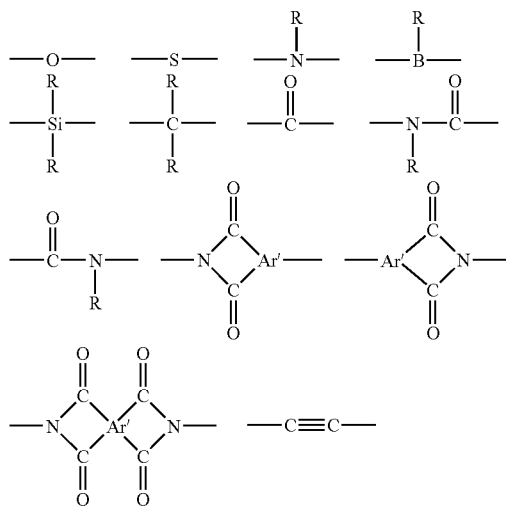

The polymer compound of the present invention may be a random, block or graft copolymer, or a polymer having an intermediate structure between them, for example, a random copolymer taking on a blocking property. From the standpoint of obtaining a polymer compound having high fluorescent quantum yield, a random copolymer taking on a blocking property, and a block or graft copolymer are more preferable than complete random copolymers. Those having branching in the main chain and having three or more ends, and dendrimers are also included.

When the polymer compound of the present invention is used as a light emitting material of a polymer LED, luminescence or phosphorescence from a thin film is utilized, thus, those showing fluorescence or phosphorescence at solid state are preferable as the polymer compound of the present invention.

As the good solvent for the polymer compound of the present invention, chloroform, methylene chloride, dichloroethane, tetrahydrofuran, toluene, xylene, mesitylene, tetralin, decalin, n-butylbenzene and the like are exemplified. Depending on the structure and molecular weight of the polymer compound, the polymer compound can be dissolved in these solvents usually in an amount of 0.1 wt % or more.

Next, the method for producing a polymer compound of the present invention will be described.

A polymer compound of the present invention containing a repeating unit of the above-described formula (2) can be produced, for example, by condensation-polymerizing a compound of the following formula as one of raw materials.

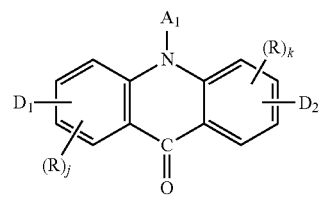

(wherein, R, j, k and $A_1$ are as in the formula (2). $D_1$ and $D_2$ represent each independently a halogen atom, alkyl sulfonate group, aryl sulfonate group, aryl alkyl sulfonate group, borate group, sulfoniummethyl group, phosphoniummethyl group, phosphonatemethyl group, methyl monohalide group, boric group, formyl group, cyanomethyl group or vinyl group).

Here, examples of the alkylsulfonate group include a methane sulfoante group, ethane sulfonate group, trifluoromethane sulfonate group and the like, and examples of the aryl sulfonate group include a benzene sulfonate group, p-toluene sulfonate group and the like, and examples of the aryl alkyl sulfonate group include a benzyl sulfonate group and the like.

As the borate group, groups of the following formulae are exemplified.

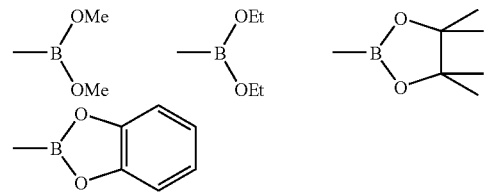

As the sulfoniummethyl group, groups of the following formulae are exemplified.

—$CH_2S^+Me_2Xh^-$, —$CH_2S^+Ph_2Xh^-$ (Xh represents a halogen atom)

As the phosphoniummethyl group, groups of the following formula are exemplified.

—$CH_2P^+Ph_3Xh^-$ (Xh represents a halogen atom)

As the phosphonatemethyl group, groups of the following formula are exemplified.

—$CH_2PO(OR''')_2$ (R''' represents an alkyl group, aryl group or arylalkyl group.)

Examples of the methyl monohalide group include a methyl fluoride group, methyl chloride group, methyl bromide group and methyl iodide group.

Regarding the condensation polymerization method, when, for example, the main chain has a vinylene group, other monomers are used according to demands, and for example, methods such as [1] polymerization by the Wittig reaction of a compound having an aldehyde group and a compound having a phosphonium salt group, [2] polymerization by the Wittig reaction of a compound having an aldehyde group and a phosphonium salt group, [3] polymerization by the Heck reaction of a compound having a vinyl group and a compound having a halogen atom, [4] polymerization by the Heck reaction of a compound having a vinyl group and a halogen atom, [5] polymerization by the Horner-Wadsworth-Emmons method of a compound having an aldehyde group and a compound having an alkyl sulfonate group, [6] polymerization by the Horner-Wadsworth-Emmons method of a compound having an aldehyde group and an alkyl sulfonate group, [7] polycondensation by the dehydrohalogenation method of a compound having two or more methyl halide groups, [r] polycondensation by the sulfonium salt decomposition method of a compound having two or more sulfonium salt groups, [9] polymerization by the Knoevenagel reaction of a compound having an aldehyde group and a compound having an acetonitrile group, [10] polymerization by the Knoevenagel reaction of a compound having an aldehyde group and an acetonitrile group, and the like, methods such as [11] polymerization by the McMurry reaction of a compound having two or more aldehyde groups, and the like, are exemplified.

As the method for producing a polymer compound of the present invention, for example, [12] a method of polymerization by the Suzuki coupling reaction, [13] a method of polymerization by the Grignard reaction, [14] a method of polymerization with a Ni(0) catalyst, [15] a method of polymerization with an oxidizer such as $FeCl_3$ and the like, a method of electrochemical oxidation polymerization, [16] a method by decomposition of an intermediate polymer having a suitable leaving group, and the like, are exemplified.

As the reaction using a Ni(0) catalyst, exemplified is a method of polymerization in the presence of a zerovalent nickel complex $\{Ni(COD)_2\}$.

As the zerovalent nickel complex, bis(1,5-cyclooctadiene)nickel(0), (ethylene)bis(triphenylphosphine)nickel(0), tetrakis(triphenylphosphine)nickel and the like are exemplified, and of them, bis(1,5-cyclooctadiene)nickel(0) is preferable from the standpoint of general versatility and cheap price.

Addition of a neutral ligand is preferable from the standpoint of improvement in yield.

Here, the neutral ligand is a ligand having no anion and cation, and exemplified are nitrogen-containing ligands such as 2,2'-bipyridyl, 1,10-phenanthroline, methylenebisoxazoline, N,N'-tetramethylethylenediamine and the like; tertiary phosphine ligands such as triphenylphosphine, tritolylphosphine, tributylphosphine, triphenoxyphosphine and the like, and nitrogen-containing ligands are preferable from the standpoint of general versatility and cheap price, and 2,2'-bipyridyl is particularly preferable from the standpoint of high reactivity and high yield. Particularly, a system obtained by adding 2,2'-bipyridyl as a neutral ligand to a system containing bis(1,5-cyclooctadiene)nickel(0) is preferable from the standpoint of improvement in yield of a polymer.

The polymerization solvent is not particularly restricted providing it does not disturb polymerization, and examples thereof include amide solvents, aromatic hydrocarbon solvents, ether solvents, ester solvents and the like.

Examples of the amide solvent include N,N-dimethylformamide, N,N-dimethylacetamide and the like.

The aromatic hydrocarbon solvent is a solvent composed of an aromatic hydrocarbon compound, and examples thereof include benzene, toluene, xylene, trimethylbenzene, tetramethylbenzene, butylbenzene, naphthalene, tetralin and the like, and preferable are toluene, xylene, tetralin, tetramethylbenzene and the like.

The ether solvent is a solvent composed of a compound in which hydrocarbon groups are connected via an oxygen atom, and examples thereof include diisopropyl ether, tetrahydrofuran, 1,4-dioxane, diphenyl ether, ethylene glycol dimethyl ether, tert-butyl methyl ether and the like, and tetrahydrofuran, 1,4-dioxane and the like as a good solvent for a polymer compound are preferable.

These solvents may be mixed and used from the standpoint of improvement of polymerizability and solubility.

The polymerization reaction is carried out usually under an atmosphere of an inert gas such as argon, nitrogen and the like.

The polymerization time is usually about 0.5 to 100 hours, and from the standpoint of production cost, times of 30 hours or less are preferable.

The polymerization temperature is usually about 0 to 200° C., and from the standpoint of high yield and low heating cost, temperatures of 0 to 100° C. are preferable.

As the reaction in the presence of a Pd catalyst, for example, the Suzuki coupling reaction is mentioned.

As the palladium catalyst used in the Suzuki coupling reaction, exemplified are palladium acetate, palladium[tetrakis(triphenylphosphine)] complex, bis(tricyclohexylphosphine)palladium complex and the like.

As the phosphorus ligand, exemplified are triphenylphosphine, tri(o-tolyl)phosphine, 1,3-bis(diphenylphosphino)propane and the like.

For example, palladium[tetrakis(triphenylphosphine)] is used, and an inorganic salt group such as potassium carbonate, sodium carbonate, barium hydroxide and the like, an organic salt group such as triethylamine and the like, or an inorganic salt such as cesium fluoride and the like is added in an amount of equivalent or more, preferably 1 to 10 equivalents based on the monomer and they are reacted. It may also be permissible that an inorganic salt is used in the form of aqueous solution and the reaction is performed in a two-phase system. Examples of the solvent include N,N-dimethylformamide, toluene, dimethoxyethane, tetrahydrofuran and the like. Depending on the solvent, temperatures of about 50 to 160° C. are suitably used. The mixture may be heated up to near the boiling point of the solvent and refluxed. The reaction time is about 1 hour to 200 hours.

Of them, preferable are the methods of polymerization by the Wittig reaction, polymerization by the Heck reaction, polymerization by the Horner-Wadsworth-Emmons method, polymerization by the Knoevenagel reaction, polymerization by the Suzuki coupling reaction, polymerization by the Grignard reaction and polymerization with a Ni(0) catalyst because of easiness of obtaining raw materials and simplicity of the polymerization reaction operation.

After completion of production of a polymer compound of the present invention, if necessary, the compound may be subjected to conventional separation operations such as acid washing, alkali washing, neutralization, water washing, organic solvent washing, re-precipitation, centrifugal separation, extraction, column chromatography and the like, purification operations, drying or other operations.

When a polymer compound of the present invention is used as a light emitting material of a polymer LED, its purity exerts an influence on light emitting property, thus, it is preferable, in the production method of the present invention, to perform the above-mentioned separation operations and purification operations sufficiently to remove unreacted monomers, by-products, catalyst residues and the like sufficiently.

In drying, conditions for sufficient removal of the remaining solvent are advantageous. For preventing degradation of a polymer compound, it is preferable to provide shading and perform drying in an inert atmosphere. It is preferable to perform drying at temperatures not causing thermal degradation of a polymer compound.

The polymer compound of the present invention can be used as a light emitting material. Further, the polymer compound of the present invention can be used also as a charge transporting material, organic semiconductor material, optical material, or electrically conductive material by doping.

By allowing at least one of the polymer compound of the present invention and at least one material selected from the group consisting of hole transporting materials, electron transporting materials and light emitting materials to be contained, a composition can be prepared. In the following descriptions, "polymer compound" is a concept including a composition.

The polymer compound of the present invention is useful also for production of thin films such as electrically conductive thin films, organic semiconductor thin films and the like. These film films have a thickness of usually 1 nm to 1 μm, preferably 2 nm to 500 nm. By using this organic semiconductor thin film, an organic transistor having the organic semiconductor thin film can be produce.

Next, the polymer LED of the present invention will be described.

The polymer LED of the present invention is characterized in that a light emitting layer is present between electrodes composed of an anode and a cathode wherein the light emitting layer contains a light emitting material of the present invention.

As the polymer LED of the present invention, mentioned are polymer LED having an electron transporting layer provided between a cathode and a light emitting layer, polymer LED having a hole transporting layer provided between an anode and a light emitting layer, polymer LED having an electron transporting layer provided between a cathode and a light emitting layer and having a hole transporting layer provided between an anode and a light emitting layer.

Moreover, the polymer LED of the present invention include a polymer-LED in which a layer containing a conductive polymer is disposed between at least one of the above electrodes and a light emitting layer adjacently to the electrode; and a polymer LED in which a buffer layer having a mean film thickness of 2 nm or less is disposed between at least one of the above electrodes and a light emitting layer adjacently to the electrode.

Specifically, the following structures a)-d) are exemplified.
a) anode/light emitting layer/cathode
b) anode/hole transporting layer/light emitting layer/cathode
c) anode/light emitting layer/electron transporting layer/cathode
d) anode/hole transporting layer/light emitting layer/electron transporting layer/cathode
(wherein, "/" indicates adjacent lamination of layers. Hereinafter, the same).

Herein, the light emitting layer is a layer having function to emit a light, the hole transporting layer is a layer having function to transport a hole, and the electron transporting layer is a layer having function to transport an electron. Herein, the electron transporting layer and the hole transporting layer are generically called a charge transporting layer. The light emitting layer, hole transporting layer and electron transporting layer also may be used each independently in two or more layers.

Charge transporting layers disposed adjacent to an electrode, that having function to improve charge injecting efficiency from the electrode and having effect to decrease driving voltage of an device are particularly called sometimes a charge injecting layer (hole injecting layer, electron injecting layer) in general.

For enhancing adherence with an electrode and improving charge injection from an electrode, the above-described charge injecting layer or insulation layer having a thickness of 2 nm or less may also be provided adjacent to an electrode, and further, for enhancing adherence of the interface, preventing mixing and the like, a thin buffer layer may also be inserted into the interface of a charge transporting layer and light emitting layer.

The order and number of layers laminated and the thickness of each layer can be appropriately applied while considering light emitting efficiency and life of the device.

In the present invention, as the polymer LED having a charge injecting layer (electron injecting layer, hole injecting layer) provided, there are listed a polymer LED having a charge injecting layer provided adjacent to a cathode and a polymer LED having a charge injecting layer provided adjacent to an anode.

For example, the following structures e) to p) are specifically exemplified.
e) anode/charge injecting layer/light emitting layer/cathode
f) anode/light emitting layer/charge injecting layer/cathode
g) anode/charge injecting layer/light emitting layer/charge injecting layer/cathode
h) anode/charge injecting layer/hole transporting layer/light emitting layer/cathode
i) anode/hole transporting layer/light emitting layer/charge injecting layer/cathode
j) anode/charge injecting layer/hole transporting layer/light emitting layer/charge injecting layer/cathode
k) anode/charge injecting layer/light emitting layer/electron transporting layer/cathode
l) anode/light emitting layer/electron transporting layer/charge injecting layer/cathode
m) anode/charge injecting layer/light emitting layer/electron transporting layer/charge injecting layer/cathode
n) anode/charge injecting layer/hole transporting layer/light emitting layer/electron transporting layer/cathode
o) anode/hole transporting layer/light emitting layer/electron transporting layer/charge injecting layer/cathode
p) anode/charge injecting layer/hole transporting layer/light emitting layer/electron transporting layer/charge injecting layer/cathode As the specific examples of the charge injecting layer, there are exemplified layers containing an conducting polymer, layers which are disposed between an anode and a hole transporting layer and contain a material having an ionization potential between the ionization potential of an anode material and the ionization potential of a hole transporting material contained in the hole transporting layer, layers which are disposed between a cathode and an electron transporting layer and contain a material having an electron affinity between the electron affinity of a cathode material and the electron affinity of an electron transporting material contained in the electron transporting layer, and the like.

When the above-described charge injecting layer is a layer containing an conducting polymer, the electric conductivity of the conducting polymer is preferably $10^{-5}$ S/cm or more and $10^3$ S/cm or less, and for decreasing the leak current between light emitting pixels, more preferably $10^{-5}$ S/cm or more and $10^2$ S/cm or less, further preferably $10^{-5}$ S/cm or more and $10^1$ S/cm or less.

Usually, to provide an electric conductivity of the conducting polymer of $10^{-5}$ S/cm or more and $10^3$ S/cm or less, a suitable amount of ions are doped into the conducting polymer.

Regarding the kind of an ion doped, an anion is used in a hole injecting layer and a cation is used in an electron injecting layer. As examples of the anion, a polystyrene sulfonate ion, alkylbenzene sulfonate ion, camphor sulfonate ion and the like are exemplified, and as examples of the cation, a lithium ion, sodium ion, potassium ion, tetrabutyl ammonium ion and the like are exemplified.

The thickness of the charge injecting layer is for example, from 1 nm to 100 nm, preferably from 2 nm to 50 nm.

Materials used in the charge injecting layer may properly be selected in view of relation with the materials of electrode and adjacent layers, and there are exemplified conducting polymers such as polyaniline and derivatives thereof, polythiophene and derivatives thereof, polypyrrole and derivatives thereof, poly(phenylene vinylene) and derivatives thereof, poly(thienylene vinylene) and derivatives thereof, polyquinoline and derivatives thereof, polyquinoxaline and derivatives thereof, polymers containing aromatic amine structures in the main chain or the side chain, and the like, and metal phthalocyanine (copper phthalocyanine and the like), carbon and the like.

The insulation layer having a thickness of 2 nm or less has function to make charge injection easy. As the material of the above-described insulation layer, metal fluoride, metal oxide, organic insulation materials and the like are listed. As the polymer LED having an insulation layer having a thickness of 2 nm or less, there are listed polymer LEDs having an insulation layer having a thickness of 2 nm or less provided adjacent to a cathode, and polymer LEDs having an insulation layer having a thickness of 2 nm or less provided adjacent to an anode.

Specifically, there are listed the following structures q) to ab) for example.

q) anode/insulation layer having a thickness of 2 nm or less/light emitting layer/cathode
r) anode/light emitting layer/insulation layer having a thickness of 2 nm or less/cathode
s) anode/insulation layer having a thickness of 2 nm or less/light emitting layer/insulation layer having a thickness of 2 nm or less/cathode
t) anode/insulation layer having a thickness of 2 nm or less/hole transporting layer/light emitting layer/cathode
u) anode/hole transporting layer/light emitting layer/insulation layer having a thickness of 2 nm or less/cathode
v) anode/insulation layer having a thickness of 2 nm or less/hole transporting layer/light emitting layer/insulation layer having a thickness of 2 nm or less/cathode
w) anode/insulation layer having a thickness of 2 nm or less/light emitting layer/electron transporting layer/cathode
x) anode/light emitting layer/electron transporting layer/insulation layer having a thickness of 2 nm or less/cathode
y) anode/insulation layer having a thickness of 2 nm or less/light emitting layer/electron transporting layer/insulation layer having a thickness of 2 nm or less/cathode
z) anode/insulation layer having a thickness of 2 nm or less/hole transporting layer/light emitting layer/electron transporting layer/cathode
aa) anode/hole transporting layer/light emitting layer/electron transporting layer/insulation layer having a thickness of 2 nm or less/cathode
ab) anode/insulation layer having a thickness of 2 nm or less/hole transporting layer/light emitting layer/electron transporting layer/insulation layer having a thickness of 2 nm or less/cathode The thickness of a light emitting layer in a polymer LED of the present invention has an optimum value varying depending on a material to be used and may be advantageously selected to give suitable driving voltage and light emitting efficiency, and is, for example, from 1 nm to 1 μm, preferably from 2 nm to 500 nm, further preferably from 5 nm to 200 nm.

In the polymer LED of the present invention, a light emitting material other than the above-mentioned polymer compound may be mixed and used in a light emitting layer. In the polymer LED of the present invention, a light emitting layer containing a light emitting material other than the above-mentioned polymer compound may be laminated to a light emitting layer containing the above-mentioned polymer compound.

As the light emitting material, known materials can be used. In the case of a compound of lower molecular weight, there can be used, for example, naphthalene derivatives, anthracene or derivatives thereof, perylene or derivatives thereof; coloring matters such as polymethine, xanthene, coumarin, cyanine and the like; metal complexes of 8-hydroxyquinoline or derivatives thereof; aromatic amines, tetraphenylcyclopentadiene or derivatives thereof, tetraphenylbutadiene or derivatives thereof, metal complexes of 2-phenylpyridine or derivatives thereof, metal complexes of acetylacetone or derivatives thereof, and the like.

Specifically, known compounds such as those described in, for example, JP-A Nos. 57-51781 and 59-194393, and the like, can be used.

When a film is formed from a solution by use of a polymer compound of the present invention in producing a polymer LED, it may be permissible that this solution is only dried after application to remove a solvent, and also in the case of mixing of a charge transporting material or light emitting material, the same means can be applied, being very advantageous for production. As the film formation method from a solution, application methods such as a spin coat method, casting method, micro gravure coat method, gravure coat method, bar coat method, roll coat method, wire bar coat method, dip coat method, spray coat method, screen printing method, flexographic printing method, offset printing method, inkjet printing method and the like can be used.

In an ink composition (for example, used in the form of solution in a printing method and the like), at least one of the polymer compound of the present invention may be contained.

The ink composition contains usually a solvent in addition to the polymer compound of the present invention, and additives such as hole transporting materials, electron transporting materials, light emitting materials, stabilizers, additives for controlling viscosity and/or surface tension, and antioxidants and the like may be contained.

The proportion of the polymer compound of the present invention in the ink composition is usually 20 wt % to 100 wt %, preferably 40 wt % to 100 wt % based on the total weight of the composition excepting a solvent.

The proportion of a solvent in the ink composition is 1 wt % to 99.9 wt %, preferably 60 wt % to 99.9 wt %, further preferably 90 wt % to 99.8 wt % based on the total weight of the ink composition.

The viscosity of the ink composition varies depending on the printing method, and is preferably in the range from 0.5 to 500 mPa·s, at 25° C., and when the ink composition passes through a discharge apparatus such as in an inkjet printing method and the like, the viscosity is preferably in the range from 0.5 to 20 mPa·s, at 25° C. for preventing clogging and aviation curve in discharging.

As the solvent used in the ink composition, those capable of dissolving or uniformly dispersing the polymer compound of the present invention are preferable. Exemplified as the solvent are chlorine-based solvents such as chloroform, methylene chloride, 1,2-dichloroethane, 1,1,2-trichloroethane, chlorobenzene, o-dichlorobenzene and the like, ether solvents such as tetrahydrofuran, dioxane and the like, aromatic hydrocarbon solvents such as toluene, xylene, trimethylbenzene, mesitylene and the like, aliphatic hydrocarbon solvents such as cyclohexane, methylcyclohexane, n-pentane, n-hexane, n-heptane, n-octane, n-nonane, n-decane and the like, ketone solvents such as acetone, methyl ethyl ketone, cyclohexanone and the like, ester solvents such as ethyl acetate, butyl acetate, methyl benzoate, ethyl cellosolve acetate and the like, polyhydric alcohols such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerin, 1,2-hexanediol and the like and derivatives thereof, alcohol solvents such as methanol, ethanol, propanol, isopropanol, cyclohexanol and the like, sulfoxide solvents such as dimethyl sulfoxide and the like, and amide solvents such as N-methyl-2-pyrrolidone, N,N-dimethylformamide and the like. These organic solvents can be used singly or in combination of two or more. Of the above-described solvents, at least one organic solvent having a structure containing at least one benzene ring and having a melting point of 0° C. or lower and a boiling point of 100° C. or higher is preferably contained.

Regarding the kind of the solvent, aromatic hydrocarbon solvents, aliphatic hydrocarbon solvents, ester solvents and ketone solvents are preferable from the standpoint of solubility of the polymer compound of the present invention into an organic solvent, uniformity in film formation, viscosity property and the like, and toluene, xylene, ethylbenzene, diethylbenzene, trimethylbenzene, mesitylene, n-propylbenzene, i-propylbenene, n-butylbenzene, i-butylbenzene, s-butylbenzene, anisole, ethoxybenzene, 1-methylnaphthalene, cyclohexane, cyclohexanone, cyclohexylbenzene, bicyclohexyl, cyclohexenylcyclohexanone, n-heptylcyclohexane, n-hexylcyclohexane, methyl benzoate, 2-propylcyclohexanone, 2-heptanone, 3-heptanone, 4-heptanone, 2-octanone, 2-nonanone, 2-decanone and dicyclohexylketone are preferable, and at least one of xylene, anisole, mesitylene, cyclohexylbenzene and bicyclohexylmethyl benzoate is more preferably contained.

Of additives which can be contained in the ink composition of the present invention, mentioned as the hole transporting layer are polyvinylcarbazole or derivatives thereof, polysilane or derivatives thereof, polysiloxane derivatives having an aromatic amine at a side chain or main chain, pyrazoline derivatives, arylamine derivatives, stilbene derivatives, triphenyldiamine derivatives, polyaniline or derivatives thereof, polythiophene or derivatives thereof, polypyrrole or derivatives thereof, poly(p-phenylenevinylene) or derivatives thereof, and poly(2,5-thienylenevinylene) or derivatives thereof.

Mentioned as the electron transporting material are oxadiazole derivatives, anthraquinodimethane or derivatives thereof, benzoquinone or derivatives thereof, naphthoquinone or derivatives thereof, anthraquinone or derivatives thereof, tetracyanoanthraquinodimethane or derivatives thereof, fluorenone derivatives, diphenyldicyanoethylene or derivatives thereof, diphenoquinone derivatives; metal complexes of 8-hydroxyquinoline or derivatives thereof; polyquinoline or derivatives thereof, polyquinoxaline or derivatives thereof, polyfluorene or derivatives thereof.

Mentioned as the light emitting material are naphthalene derivatives, anthracene or derivatives thereof, perylene or derivatives thereof; coloring matters such as polymethine, xanthene, coumarin, cyanine and the like; metal complexes of 8-hydroxyquinoline or derivatives thereof; aromatic amines, tetraphenylcyclopentadiene or derivatives thereof, tetraphenylbutadiene or derivatives thereof, and the like.

As the stabilizer, phenol-based antioxidants, phosphorus-based antioxidants and the like are mentioned.

As the additives for controlling viscosity and/or surface tension, polymer compounds of higher molecular weight (thickening agents) for enhancing viscosity, poor solvents, compounds of lower molecular weight for lowering viscosity, surfactants for lowering surface tension, and the like may be appropriately combined and used.

As the above-described polymer compound of higher molecular weight, those which are soluble in the same solvent as for the polymer compound of the present invention and do not disturb light emission and charge transportation are advantageous. For example, polystyrene and polymethyl methacrylate of higher molecular weight, or polymer compounds of the present invention having higher molecular weight, and the like can be used. The weight average molecular weight is preferably 500000 or more, and more preferably 1000000 or more. A poor solvent can also be used as a thickening agent. That is, viscosity can be enhanced by adding a small amount of poor solvent for solid components in a solution. When a poor solvent is added for this purpose, the kind and addition amount of the solvent may be advantageously selected so as not to cause deposition of solid components in a solution. When stability in preservation is also taken into consideration, the amount of a poor solvent is preferably 50 wt % or less, further preferably 30 wt % or less based on the whole solution.

As the antioxidant, those which are soluble in the same solvent as for the polymer compound of the present invention and dot not disturb light emission and charge transportation are advantageous, and exemplified are phenol-based antioxidants, phosphorus-based antioxidants and the like. By using the antioxidant, preservation stability of the polymer compound of the present invention and the solvent can be improved.

From the standpoint of solubility of the polymer compound of the present invention into a solvent, the difference between solubility parameter of the solvent and solubility parameter of the polymer compound is preferably 10 or less, more preferably 7 or less.

The solubility parameter of the solvent and the solubility parameter of the polymer compound of the present invention can be measured by a method described in "Solvent Handbook (Kodansha Ltd. Publishers, 1976)".

The polymer compounds of the present invention to be contained in an ink composition may be used singly or in combination of two or more, and polymer compounds other than the polymer compound of the present invention may be contained in a range not deteriorating device properties and the like.

The thickness of a light emitting layer has an optimum value varying depending on a material to be used and may be advantageously selected to give suitable driving voltage and light emitting efficiency, and is, for example, from 1 nm to 1 μm, preferably from 2 nm to 500 nm, further preferably from 5 nm to 200 nm.

When the polymer LED of the present invention has a hole transporting layer, as the hole transporting materials used, there are exemplified polyvinylcarbazole or derivatives thereof, polysilane or derivatives thereof, polysiloxane derivatives having an aromatic amine in the side chain or the main chain, pyrazoline derivatives, arylamine derivatives, stilbene derivatives, triphenyldiamine derivatives, polyaniline or derivatives thereof, polythiophene or derivatives thereof, polypyrrole or derivatives thereof, poly(p-phenylenevinylene) or derivatives thereof, poly(2,5-thienylenevinylene) or derivatives thereof, or the like.

Specific examples of the hole transporting material include those described in JP-A Nos. 63-70257, 63-175860, 2-135359, 2-135361, 2-209988, 3-37992 and 3-152184.

Among them, as the hole transporting materials used in the hole transporting layer, preferable are polymer hole transporting materials such as polyvinylcarbazole or derivatives thereof, polysilane or derivatives thereof, polysiloxane derivatives having an aromatic amine compound group in the side chain or the main chain, polyaniline or derivatives thereof, polythiophene or derivatives thereof, poly(p-phenylenevinylene) or derivatives thereof, poly(2,5-thienylenevinylene) or derivatives thereof, or the like, and further preferable are polyvinylcarbazole or derivatives thereof, polysilane or derivatives thereof and polysiloxane derivatives having an aromatic amine compound group in the side chain or the main chain. In the case of a hole transporting material having lower molecular weight, it is preferably dispersed in a polymer binder for use.

Polyvinylcarbazole or derivatives thereof are obtained, for example, by cation polymerization or radical polymerization from a vinyl monomer.

As the polysilane or derivatives thereof, there are exemplified compounds described in Chem. Rev., 89, 1359 (1989) and GB 2300196 published specification, and the like. For synthesis, methods described in them can be used, and a Kipping method can be suitably used particularly.

As the polysiloxane or derivatives thereof, those having the structure of the above-described hole transporting material having lower molecular weight in the side chain or main chain, since the siloxane skeleton structure has poor hole transporting property. Particularly, there are exemplified those having an aromatic amine having hole transporting property in the side chain or main chain.

The method for forming a hole transporting layer is not restricted, and in the case of a hole transporting layer having lower molecular weight, a method in which the layer is formed from a mixed solution with a polymer binder is exemplified. In the case of a polymer hole transporting material, a method in which the layer is formed from a solution is exemplified.

The solvent used for the film forming from a solution is not particularly restricted providing it can dissolve a hole transporting material. As the solvent, there are exemplified chlorine solvents such as chloroform, methylene chloride, dichloroethane and the like, ether solvents such as tetrahydrofuran and the like, aromatic hydrocarbon solvents such as toluene, xylene and the like, ketone solvents such as acetone, methyl ethyl ketone and the like, and ester solvents such as ethyl acetate, butyl acetate, ethylcellosolve acetate and the like.

As the film forming method from a solution, there can be used coating methods such as a spin coating method, casting method, micro gravure coating method, gravure coating method, bar coating method, roll coating method, wire bar coating method, dip coating method, spray coating method, screen printing method, flexo printing method, offset printing method, inkjet printing method and the like, from a solution.

The polymer binder mixed is preferably that does not disturb charge transport extremely, and that does not have strong absorption of a visible light is suitably used. As such polymer binder, polycarbonate, polyacrylate, poly(methyl acrylate), poly(methyl methacrylate), polystyrene, poly(vinyl chloride), polysiloxane and the like are exemplified.

Regarding the thickness of the hole transporting layer, the optimum value differs depending on material used, and may properly be selected so that the driving voltage and the light emitting efficiency become optimum values, and at least a thickness at which no pin hole is produced is necessary, and too large thickness is not preferable since the driving voltage of the device increases. Therefore, the thickness of the hole transporting layer is, for example, from 1 nm to 1 μm, preferably from 2 nm to 500 nm, further preferably from 5 nm to 200 nm.

When the polymer LED of the present invention has an electron transporting layer, known compounds are used as the electron transporting materials, and there are exemplified oxadiazole derivatives, anthraquinodimethane or derivatives thereof, benzoquinone or derivatives thereof, naphthoquinone or derivatives thereof, anthraquinone or derivatives thereof, tetracyanoanthraquinodimethane or derivatives thereof, fluorenone derivatives, diphenyldicyanoethylene or derivatives thereof, diphenoquinone derivatives, or metal complexes of 8-hydroxyquinoline or derivatives thereof, polyquinoline and derivatives thereof, polyquinoxaline and derivatives thereof, polyfluorene or derivatives thereof, and the like.

Specifically, there are exemplified those described in JP-A Nos. 63-70257, 63-175860, 2-135359, 2-135361, 2-209988, 3-37992 and 3-152184.

Among them, oxadiazole derivatives, benzoquinone or derivatives thereof, anthraquinone or derivatives thereof, or metal complexes of 8-hydroxyquinoline or derivatives thereof, polyquinoline and derivatives thereof, polyquinoxaline and derivatives thereof, polyfluorene or derivatives thereof are preferable, and 2-(4-biphenyl)-5-(4-t-butylphenyl)-1,3,4-oxadiazole, benzoquinone, anthraquinone, tris(8-quinolinol)aluminum and polyquinoline are further preferable.

The method for forming the electron transporting layer is not particularly restricted, and in the case of an electron transporting material having lower molecular weight, a vapor deposition method from a powder, or a method of film-forming from a solution or melted state is exemplified, and in the case of a polymer electron transporting material, a method of film-forming from a solution or melted state is exemplified, respectively.

The solvent used in the film-forming from a solution is not particularly restricted provided it can dissolve electron transporting materials and/or polymer binders. As the solvent, there are exemplified chlorine solvents such as chloroform, methylene chloride, dichloroethane and the like, ether solvents such as tetrahydrofuran and the like, aromatic hydrocarbon solvents such as toluene, xylene and the like, ketone solvents such as acetone, methyl ethyl ketone and the like, and ester solvents such as ethyl acetate, butyl acetate, ethylcellosolve acetate and the like.

As the film-forming method from a solution or melted state, there can be used coating methods such as a spin coating method, casting method, micro gravure coating method, gravure coating method, bar coating method, roll coating method, wire bar coating method, dip coating method, spray coating method, screen printing method, flexo printing method, offset printing method, inkjet printing method and the like.

The polymer binder to be mixed is preferably that which does not extremely disturb a charge transport property, and that does not have strong absorption of a visible light is suitably used. As such polymer binder, poly(N-vinylcarbazole), polyaniline or derivatives thereof, polythiophene or derivatives thereof, poly(p-phenylene vinylene) or derivatives thereof, poly(2,5-thienylene vinylene) or derivatives thereof, polycarbonate, polyacrylate, poly(methyl acrylate), poly(methyl methacrylate), polystyrene, poly(vinyl chloride), polysiloxane and the like are exemplified.

Regarding the thickness of the electron transporting layer, the optimum value differs depending on material used, and may properly be selected so that the driving voltage and the light emitting efficiency become optimum values, and at least a thickness at which no pin hole is produced is necessary, and too large thickness is not preferable since the driving voltage of the device increases. Therefore, the thickness of the electron transporting layer is, for example, from 1 nm to 1 µm, preferably from 2 nm to 500 nm, further preferably from 5 nm to 200 nm.

The substrate forming the polymer LED of the present invention may preferably be that does not change in forming an electrode and layers of organic materials, and there are exemplified glass, plastics, polymer film, silicon substrates and the like. In the case of a opaque substrate, it is preferable that the opposite electrode is transparent or semitransparent.

Usually, at least one of the electrodes consisting of an anode and a cathode, is transparent or semitransparent. It is preferable that the anode is transparent or semitransparent.

As the material of this anode, electron conductive metal oxide films, semitransparent metal thin films and the like are used. Specifically, there are used indium oxide, zinc oxide, tin oxide, and composition thereof, i.e. indium/tin/oxide (ITO), and films (NESA and the like) fabricated by using an electron conductive glass composed of indium/zinc/oxide, and the like, and gold, platinum, silver, copper and the like. Among them, ITO, indium/zinc/oxide, tin oxide are preferable. As the fabricating method, a vacuum vapor deposition method, sputtering method, ion plating method, plating method and the like are used. As the anode, there may also be used organic transparent conducting films such as polyaniline or derivatives thereof, polythiophene or derivatives thereof and the like.

The thickness of the anode can be appropriately selected while considering transmission of a light and electric conductivity, and for example, from 10 nm to 10 µm, preferably from 20 nm to 1 µm, further preferably from 50 nm to 500 nm.

Further, for easy charge injection, there may be provided on the anode a layer comprising a phthalocyanine derivative conducting polymers, carbon and the like, or a layer having an average film thickness of 2 nm or less comprising a metal oxide, metal fluoride, organic insulating material and the like.

As the material of a cathode used in the polymer LED of the present invention, that having lower work function is preferable. For example, there are used metals such as lithium, sodium, potassium, rubidium, cesium, beryllium, magnesium, calcium, strontium, barium, aluminum, scandium, vanadium, zinc, yttrium, indium, cerium, samarium, europium, terbium, ytterbium and the like, or alloys comprising two of more of them, or alloys comprising one or more of them with one or more of gold, silver, platinum, copper, manganese, titanium, cobalt, nickel, tungsten and tin, graphite or graphite intercalation compounds and the like. Examples of alloys include a magnesium-silver alloy, magnesium-indium alloy, magnesium-aluminum alloy, indium-silver alloy, lithium-aluminum alloy, lithium-magnesium alloy, lithium-indium alloy, calcium-aluminum alloy and the like. The cathode may be formed into a laminated structure of two or more layers.

The thickness of the cathode can be appropriately selected while considering transmission of a light and electric conductivity, and for example, from 10 nm to 10 µm, preferably from 20 nm to 1 µm, further preferably from 50 nm to 500 nm.

As the method for fabricating a cathode, there are used a vacuum vapor deposition method, sputtering method, lamination method in which a metal thin film is adhered under heat and pressure, and the like. Further, there may also be provided, between a cathode and an organic layer, a layer comprising an conducting polymer, or a layer having an average film thickness of 2 nm or less comprising a metal oxide, metal fluoride, organic insulation material and the like, and after fabrication of the cathode, a protective layer may also be provided which protects the polymer LED. For stable use of the polymer LED for a long period of time, it is preferable to provide a protective layer and/or protective cover for protection of the device in order to prevent it from outside damage.

As the protective layer, there can be used a polymeric compound, metal oxide, metal fluoride, metal borate and the like. As the protective cover, there can be used a glass plate, a plastic plate the surface of which has been subjected to lower-water-permeation treatment, and the like, and there is suitably used a method in which the cover is pasted with an device substrate by a thermosetting resin or light-curing resin for sealing. If space is maintained using a spacer, it is easy to prevent an device from being injured. If an inner gas such as nitrogen and argon is sealed in this space, it is possible to prevent oxidation of a cathode, and further, by placing a desiccant such as barium oxide and the like in the above-described space, it is easy to suppress the damage of an device by moisture adhered in the production process. Among them, any one means or more are preferably adopted.

The polymer LED of the present invention can be used for a flat light source, a segment display, a dot matrix display, and a liquid crystal display as a back light, etc.

For obtaining light emission in plane form using the polymer LED of the present invention, an anode and a cathode in the plane form may properly be placed so that they are laminated each other. Further, for obtaining light emission in pattern form, there is a method in which a mask with a window in pattern form is placed on the above-described plane light emitting device, a method in which an organic layer in non-light emission part is formed to obtain extremely large thickness providing substantial non-light emission, and a method in which any one of an anode or a cathode, or both of them are formed in the pattern. By forming a pattern by any of these methods and by placing some electrodes so that independent on/off is possible, there is obtained a display device of segment type which can display digits, letters, simple marks and the like. Further, for forming a dot matrix device, it may be advantageous that anodes and cathodes are made in the form of stripes and placed so that they cross at right angles. By a method in which a plurality of kinds of polymeric compounds emitting different colors of lights are placed separately or a method in which a color filter or luminescence converting filter is used, area color displays and multi color displays are obtained. A dot matrix display can be driven by passive driving, or by active driving combined with TFT and the like. These display devices can be used as a display of a computer, television, portable terminal, portable telephone, car navigation, view finder of a video camera, and the like.

Further, the above-described light emitting device in plane form is a thin self-light-emitting one, and can be suitably used as a flat light source for back-light of a liquid crystal display, or as a flat light source for illumination. Further, if a flexible plate is used, it can also be used as a curved light source or a display.

Examples are shown below for illustrating the present invention further in detail, however, the present invention is not limited to them.

Here, as the number average molecular weight and weight average molecular weight, polystyrene reduced number average molecular weight and polystyrene reduced weight average molecular weight were measured by gel permeation chromatography (GPC) using tetrahydrofuran as a solvent.

Synthesis Example 1

Synthesis of Monomer (2)

Monomer (2)

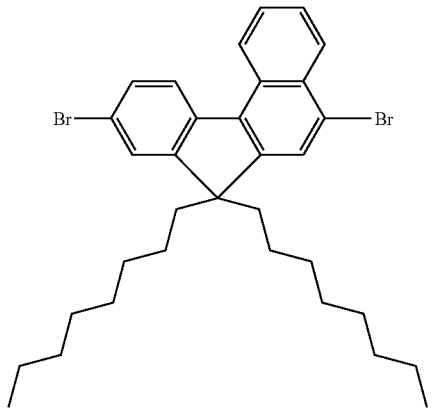

(Synthesis of Compound D)

Compound D

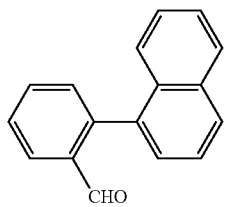

Under an inert atmosphere, into a 300 ml three-necked flask was added 5.00 g (29 mmol) of 1-naphthaleneboronic acid, 6.46 g (35 mmol) of 2-bromobenzaldehyde, 10.0 g (73 mmol) of potassium carbonate, 36 mol of toluene and 36 mol of ion exchanged water, and argon was bubbled through the mixture for 20 minutes while stirring at room temperature. Subsequently, 16.8 mg (0.15 mmol) of tetrakis(triphenylphosphine)palladium was added, and further, argon was bubbled through the mixture for 10 minutes while stirring at room temperature. The mixture was heated up to 100° C. and reacted for 25 hours. The reaction mixture was cooled down to room temperature, the organic layer was extracted with toluene, dried over sodium sulfate, then, the solvent was distilled off. Purification was performed by a silica gel column using toluene:cyclohexane=1:2 mixed solvent as a development solvent, to obtain 5.18 g (yield: 86%) of compound D as a white crystal.

$^1$H-NMR (300 MHz/CDCl$_3$):
δ 7.39-7.62 (m, 5H), 7.70 (m, 2H), 7.94 (d, 2H), 8.12 (dd, 2H), 9.63 (s, 1H)
MS (APCI(+)):(M+H)$^+$ 233

(Synthesis of Compound E)

Compound E

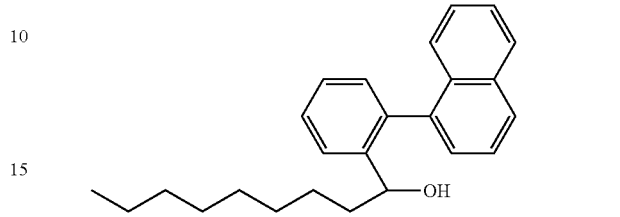

Under an inert atmosphere, into a 300 ml three-necked flask was added 8.00 g (34.4 mmol) of compound D and 46 mol of dehydrated THF, and the mixture was cooled down to −78° C. Subsequently, 52 ml of n-octylmagnesium bromide (1.0 mol/l THF solution) was dropped over 30 minutes. After completion of dropping, the mixture was heated up to 0° C., stirred for 1 hour, then, heated up to room temperature and stirred for 45 minutes. The flask was immersed in an ice bath and 20 ml of 1 N hydrochloric acid was added to stop the reaction, the organic layer was extracted with ethyl acetate, and dried over sodium sulfate. Then solvent was distilled off, then, purification was performed by a silica gel column using toluene:hexane=10:1 mixed solvent as a development solvent, to obtain 7.64 g (yield: 64%) of compound E as a pale yellow oil. Though two peaks were observed in HPLC measurement, equal mass numbers were obtained in LC-MS measurement, thus, the product was judged to be a mixture of isomers.

(Synthesis of Compound F)

Compound F

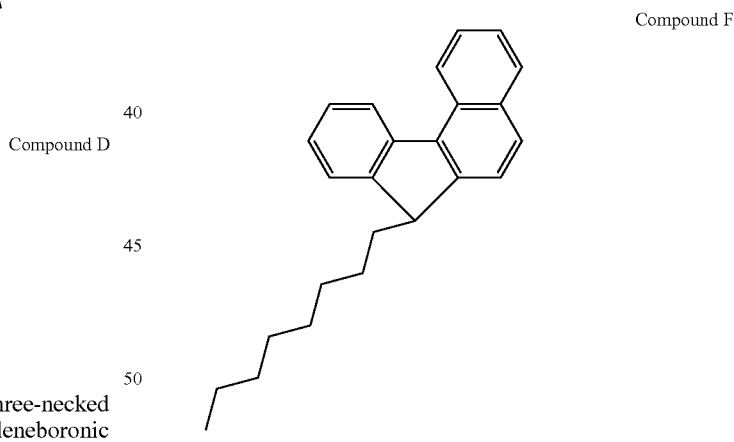

Under an inert atmosphere, into a 500 ml three-necked flask was added 5.00 g (14.4 mmol) of compound E (mixture of isomers) and 74 mol of dehydrated dichloromethane, and the mixture was stirred at room temperature to cause dissolution thereof. Subsequently, an etherate complex of boron trifluoride was dropped at room temperature over 1 hour, and after completion of dropping, the mixture was stirred at room temperature for 4 hours. 125 ml of ethanol was added slowly while stirring, and when heat generation disappeared, the organic layer was extracted with chloroform, washed with water twice, and dried over magnesium sulfate. Then solvent was distilled off, then, purification was performed by a silica gel column using hexane as a development solvent, to obtain 3.22 g (yield: 68%) of compound F as a colorless oil.

$^1$H-NMR (300 MHz/CDCl$_3$):

δ 0.90 (t, 3H), 1.03-1.26 (m, 14H), 2.13 (m, 2H), 4.05 (t, 1H), 7.35 (dd, 1H), 7.46-7.50 (m, 2H), 7.59-7.65 (m, 3H), 7.82 (d, 1H), 7.94 (d, 1H), 8.35 (d, 1H), 8.75 (d, 1H)

MS (APCI(+)):(M+H)$^+$ 329

(Synthesis of Compound G)

Compound G

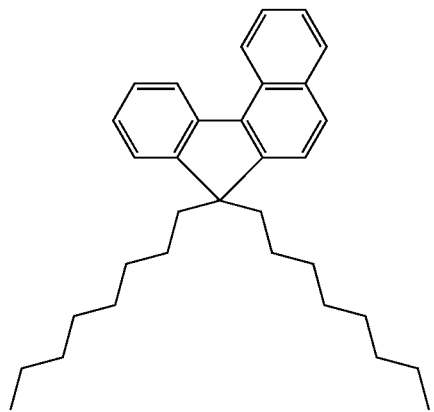

Under an inert atmosphere, into a 200 ml three-necked flask was added 20 ml of ion exchanged water, and 18.9 g (0.47 mol) of sodium hydroxide was added portionwise and dissolved while stirring. The aqueous solution was cooled down to room temperature, then, 20 ml of toluene, 5.17 g (15.7 mmol) of compound F and 1.52 g (4.72 mmol) of tributyl ammonium bromide were added and the mixture was heated up to 50° C. n-octyl bromide was dropped, and after completion of dropping, the mixture was reacted for 9 hours at 50° C. After completion of the reaction, the organic layer was extracted with toluene, washed with water twice, and dried over sodium sulfate. Purification was performed by a silica gel column using hexane as a development solvent, to obtain 5.13 g (yield: 74%) of compound G as a yellow oil.

$^1$H-NMR (300 MHz/CDCl$_3$):

δ 0.52 (m, 2H), 0.79 (t, 6H), 1.00-1.20 (m, 22H), 2.05 (t, 4H), 7.34 (d, 1H), 7.40-7.53 (m, 2H), 7.63 (m, 3H), 7.83 (d, 1H), 7.94 (d, 1H), 8.31 (d, 1H), 8.75 (d, 1H)

MS (APCI(+)):(M+H)$^+$ 441

(Synthesis of Compound H)

Compound H

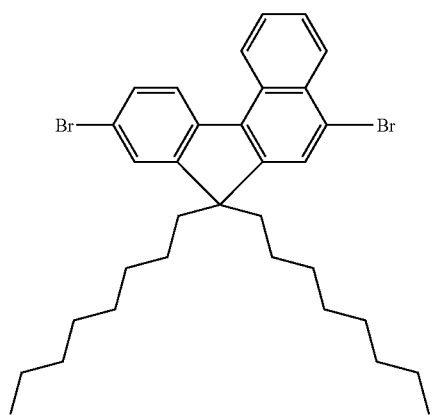

Under an air atmosphere, into a 50 ml three-necked flask was added 4.00 g (9.08 mmol) of compound G and 57 ml of acetic acid:dichloromethane=1:1 mixed solvent, and the mixture was stirred at room temperature to cause dissolution thereof. Subsequently, 7.79 g (20.0 mmol) of benzyltrimethyl ammonium tribromide was added and zinc chloride was added until complete dissolution of benzyltrimethyl ammonium tribromide while stirring. The mixture was stirred at room temperature for 20 hours, then, 10 ml of a 5% sodium hydrogen sulfite aqueous solution was added to stop the reaction, the organic layer was extracted with chloroform, washed twice with a potassium carbonate aqueous solution, and dried over sodium sulfate. Purification was performed twice by a flash column using hexane as a development solvent, then, recrystallization was performed with ethanol:hexane=1:1, then, with 10:1 mixed solvent, to obtain 4.13 g (yield: 76%) of compound H as a white crystal.

$^1$H-NMR (300 MHz/CDCl$_3$):

δ 0.60 (m, 2H), 0.91 (t, 6H), 1.01-1.38 (m, 22H), 2.09 (t, 4H), 7.62-7.75 (m, 3H), 7.89 (s, 1H), 8.20 (d, 1H), 8.47 (d, 1H), 8.72 (d, 1H)

MS (APPI(+)): (M+H)$^+$ 598

Here, the resultant compound H is called monomer (2).

Example 1

Synthesis of Polymer Compound 1

Monomer (1)

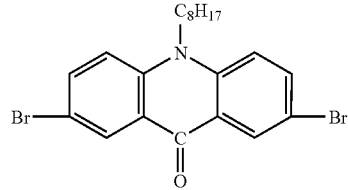

0.07 g of monomer (1), 0.81 g of monomer (2) and 0.63 g of 2,2'-bipyridyl were charged into a reaction vessel, then, an atmosphere in the reaction system was purged with a nitrogen gas. To this was added 50 g of tetrahydrofuran (dehydrated solvent) deaerated by bubbling with an argon gas previously. Next, to this mixed solution was added 1.1 g of bis(1,5-cyclooctadiene)nickel(0), and the mixture was stirred at room temperature for about 10 minutes, then, heated up and reacted at 60° C. for 3 hours. The reaction was carried out in a nitrogen atmosphere.

This reaction liquid was cooled, then, ethanol 40 ml/ion exchanged water 40 ml mixed solution was added, and the mixture was stirred for about 1 hour. This solution was allowed to stand still over night at room temperature, then, the produced precipitate was recovered by filtration. Then, this precipitate was dried under reduced pressure, then, dissolved in toluene. Insoluble materials were removed by filtrating this toluene solution. Next, this toluene solution was washed with 1 N hydrochloric acid, then, allowed to stand still, and liquid separation was caused and the toluene solution was recovered. Next, this toluene solution was washed with ca. 3% ammonia water, then, allowed to stand still, and liquid separation was caused and the toluene solution was recovered. Next, this toluene solution was washed with ion exchanged water, then, allowed to stand still, and liquid separation was caused and the toluene solution was recovered. Next, this toluene solution was poured into methanol, and purified by re-precipitation. The produced precipitate was recovered, and washed with ethanol, then, this was dried under reduced pressure, to obtain 0.13 g of a polymer. The resulting polymer is called polymer compound 1.

This polymer compound 1 had a polystyrene reduced number average molecular weight of $6.5 \times 10^4$ and a polystyrene reduced weight average molecular weight of $3.3 \times 10^5$. The structure of a repeating unit contained in polymer compound 1 estimated from charging is shown below.

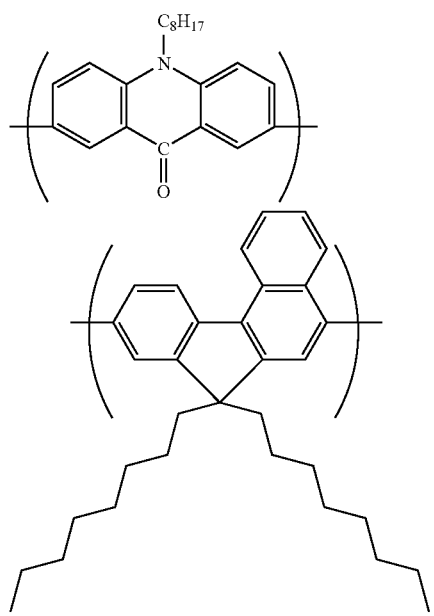

Example 2

Synthesis of Polymer Compound 2

0.07 g of monomer (1), 1.0 g of N,N'-(4-tert-butyl-2,6-dimethylphenyl)-N,N'-(4-bromophenyl)-1,4-phenylenediamine and 0.63 g of 2,2'-bipyridyl were charged into a reaction vessel, then, an atmosphere in the reaction system was purged with a nitrogen gas. To this was added 50 g of tetrahydrofuran (dehydrated solvent) deaerated by bubbling with an argon gas previously. Next, to this mixed solution was added 1.1 g of bis(1.5-cyclooctadiene)nickel(0), and the mixture was stirred at room temperature for about 10 minutes, then, heated up and reacted at 60° C. for 3 hours. The reaction was carried out in a nitrogen atmosphere.

This reaction liquid was cooled, then, methanol 40 ml/ion exchanged water 40 ml mixed solution was added, and the mixture was stirred for about 1 hour. This solution was allowed to stand still over night at room temperature, then, the produced precipitate was recovered by filtration. Then, this precipitate was dried under reduced pressure, then, dissolved in toluene. Insoluble materials were removed by filtrating this toluene solution. Next, this toluene solution was purified by passing through a column filled with alumina. Then, this toluene solution was washed with 1 N hydrochloric acid, then, allowed to standstill, and liquid separation was caused and the toluene solution was recovered. Next, this toluene solution was washed with ca. 3% ammonia water, then, allowed to stand still, and liquid separation was caused and the toluene solution was recovered. Next, this toluene solution was washed with ion exchanged water, then, allowed to stand still, and liquid separation was caused and the toluene solution was recovered. Next, this toluene solution was poured into methanol, and purified by re-precipitation. The produced precipitate was recovered, and washed with ethanol, then, this was dried under reduced pressure, to obtain 0.14 g of a polymer. The resulting polymer is called polymer compound 2.

This polymer compound 2 had a polystyrene reduced number average molecular weight of $4.8 \times 10^3$ and a polystyrene reduced weight average molecular weight of $5.8 \times 10^3$. The structure of a repeating unit contained in polymer compound 2 estimated from charging is shown below.

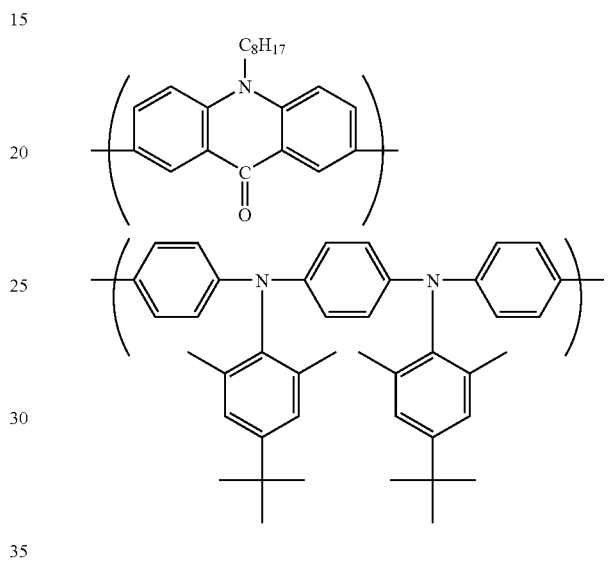

Example 3

Synthesis of Polymer Compound 3

0.035 g of monomer (1), 0.90 g of monomer (2) and 0.63 g of 2,2'-bipyridyl were charged into a reaction vessel, then, an atmosphere in the reaction system was purged with a nitrogen gas. To this was added 60 g of tetrahydrofuran (dehydrated solvent) deaerated by bubbling with an argon gas previously. Next, to this mixed solution was added 1.1 g of bis(1.5-cyclooctadiene)nickel(0), and the mixture was stirred at room temperature for about 10 minutes, then, heated up and reacted at 60° C. for 3 hours. The reaction was carried out in a nitrogen atmosphere.

This reaction liquid was cooled, then, methanol 50 ml/ion exchanged water 50 ml mixed solution was added, and the mixture was stirred for about 1 hour. This solution was allowed to stand still over night at room temperature, then, the produced precipitate was recovered by filtration. Then, this precipitate was dried under reduced pressure, then, dissolved in toluene. Insoluble materials were removed by filtrating this toluene solution. Next, this toluene solution was purified by passing through a column filled with alumina. Then, this toluene solution was washed with 1 N hydrochloric acid, then, allowed to stand still, and liquid separation was caused and the toluene solution was recovered. Next, this toluene solution was washed with ca. 3% ammonia water, then, allowed to stand still, and liquid separation was caused and the toluene solution was recovered. Next, this toluene solution was washed with ion exchanged water, then, allowed to stand still, and liquid separation was caused and the toluene solution was recovered. Next, this toluene solution was poured into methanol, and purified by re-precipitation. The produced precipitate was recovered, and washed with ethanol, then, this was dried under reduced pressure, to obtain 0.3 g of a polymer. The resulting polymer is called polymer compound 3.

This polymer compound 3 had a polystyrene reduced number average molecular weight of $8.9 \times 10^4$ and a polystyrene reduced weight average molecular weight of $4.9 \times 10^5$. The structure of a repeating unit contained in polymer compound 3 estimated from charging is shown below.

The solution was allowed to stand still, and liquid separation was caused, to obtain a purified toluene solution. Next, this toluene solution was poured into methanol, and purified by re-precipitation. The resultant precipitate was dried under reduced pressure, to obtain 0.18 g of a polymer. This polymer is called polymer compound 4.

This polymer compound 4 had a polystyrene reduced number average molecular weight of $9.8 \times 10^4$ and a polystyrene reduced weight average molecular weight of $5.7 \times 10^5$.

The structure of a repeating unit contained in polymer compound 4 estimated from charging is shown below.

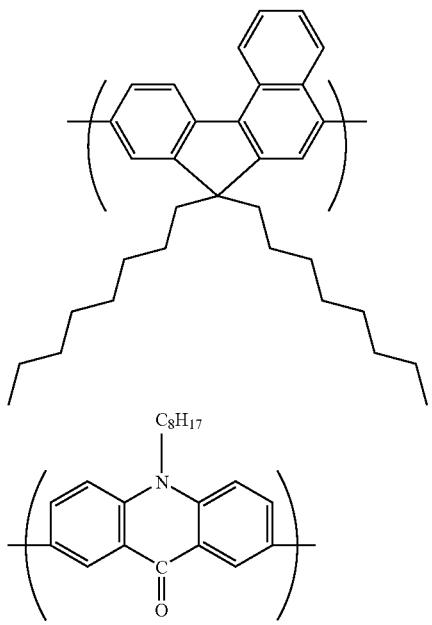

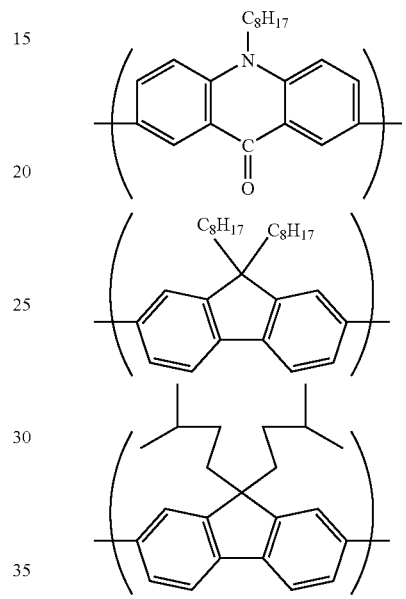

Example 4

Synthesis of Polymer Compound 4

0.07 g of monomer (1), 0.59 g of 2,7-dibromo-9,9-dioctylfluorene, 0.125 g of bromo-9,9-diisopentylfluorene and 0.63 g of 2,2'-bipyridyl were charged into a reaction vessel, then, an atmosphere in the reaction system was purged with a nitrogen gas. To this was added 60 g of tetrahydrofuran (dehydrated solvent) deaerated by bubbling with an argon gas previously. Next, to this mixed solution was added 1.1 g of bis(1.5-cyclooctadiene)nickel(0), and the mixture was stirred at room temperature for about 10 minutes, then, reacted at 60° C. for 3 hours. The reaction was carried out in a nitrogen atmosphere.

After the reaction, this solution was cooled, then, into this solution was poured methanol 50 ml/ion exchanged water 50 ml mixed solvent, and the mixture was stirred for about 1 hour. Then, the produced precipitate was recovered by filtration. This precipitate was washed with methanol, then, dried under reduced pressure. Then, this precipitate was dissolved in toluene. Insoluble materials were removed by filtrating this toluene solution, then, this toluene solution was washed with 1 N hydrochloric acid. The solution was allowed to stand still, and liquid separation was caused, then, this toluene solution was washed with ca. 3% ammonia water. The solution was allowed to stand still, and liquid separation was caused, then, this toluene solution was washed with ion exchanged water.

Example 5

Measurement of Absorption Spectrum, Fluorescent Spectrum

Polymer compounds 1 to 4 could be dissolved in chloroform. Its 0.2% chloroform solution was spin-coated on a quartz plate to form a thin film of the polymer compound. The fluorescent spectrum of this thin film was measured by JASCO FP-6500 spectrofluorometer. The fluorescent peak wavelengths of polymer compounds 1 to 4 are shown in Table 1.

TABLE 1

| polymer compound | fluorescent peak wavelength (nm) |
|---|---|
| 1 | 474 |
| 2 | 496 |
| 3 | 451 |
| 4 | 486 |

Example 6

Manufacturing and Evaluation of Device

On a glass substrate carrying thereon an ITO film with a thickness of 150 nm formed by a sputtering method, a solution prepared by filtrating a suspension of poly(3,4) ethylenedioxythiophene/polystyrenesulfonic acid (manufactured by Bayer, BaytronP AI4083) through a 0.2 μm membrane filter was spin-coated to form a thin film with a thickness of 70 nm, and dried on a hot plate at 200° C. for 10 minutes. Next, a 1.5 wt % toluene solution of polymer compound 4 was spin-coated to form a film with a thickness of 120 nm. Further, this was dried at 80° C. under reduced pressure for 1 hour, then, lithium fluoride was vapor-deposited with a thickness of about 4 nm, then, as a cathode, calcium was vapor-deposited with a thickness of about 5 nm and then aluminum was vapor-deposited with a thickness of about 70 nm, to manufacture a polymer LED. After the degree of vacuum reached $1 \times 10^{-4}$ Pa or less, vapor-deposition of a metal was initiated.

By applying voltage on the resultant device, EL light emission showing a peak at 500 nm was obtained from this device. C.I.E. color coordinate values at 100 cd/m² were x=0.23 and y=0.49, and the emitted color was blue green. The intensity of EL light emission was approximately in proportion to current density. This device showed initiation of light emission from 9.1 V, and the maximum light emitting efficiency was 0.26 cd/A.

Synthesis Example 2

Synthesis of Monomer (3)

Monomer (3)

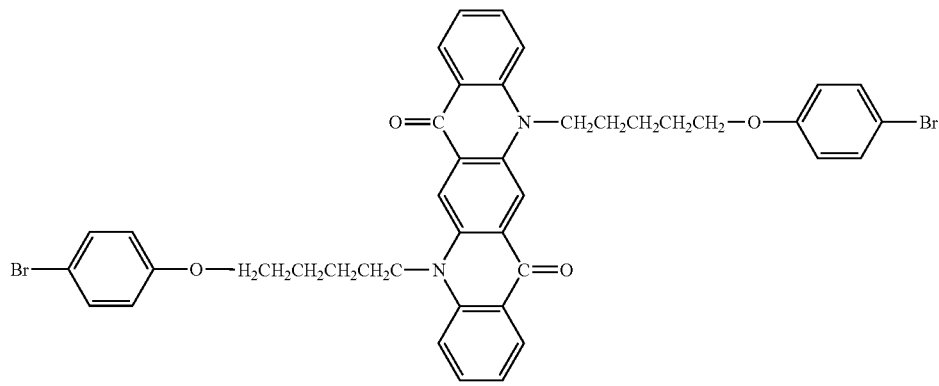

To 4-bromophenol was reacted 1,5-diiodopentane in the presence of an alkali, to obtain 1-(1-iodopentyloxy)-4-bromobenzene {compound (A)}.

Compound (A)

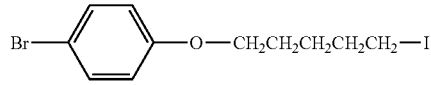

9.0 g of compound (A), 1.25 g of quinacridone and 0.91 g of benzyltriethylammonium chloride were dissolved in 70 g of 1,2-dichlorobenzene. To this solution was added 60 g of a 40% sodium hydroxide aqueous solution and the mixture was stirred vigorously, and reacted at 110° C. for 25 hours. The reaction was carried out in a nitrogen atmosphere.

After the reaction, this reaction solution was cooled. This was allowed to stand still, to find liquid separation, thus, a 1,2-dichlorobenzene solution was recovered by liquid separation. To this 1,2-dichlorobenzene solution was added toluene, then, this solution was washed with water. After water washing, the oil layer was recovered by liquid separation, and allowed to stand still, to find production of a precipitate. Next, this solution was filtrated to recover the produced precipitate.

Next, this precipitate was washed with ethanol, and dried under reduced pressure, then, dissolved in chloroform. This solution was filtrated to remove insoluble materials, then, purified by using a column filled with alumina.

The resultant solution was poured into methanol, and purified by re-precipitation. Then, the produced precipitate was recovered by a filtration operation. This precipitate was dried under reduced pressure to obtain 100 mg of monomer (3).

$^1$H-NMR (300 MHz/CDCl$_3$):

δ 1.76-2.15 (12H), 4.01 (4H), 4.56 (4H), 6.77-6.82 (4H), 7.25-7.79 (10H), 8.56-8.77 (4H)

MS (APCI(+)):(M+H)$^+$ 795

Example 7

Synthesis of Polymer Compound (5)

15 mg of monomer (3), 720 mg of monomer (2) and 0.53 g of 2,2'-bipyridyl were dissolved in 50 g of tetrahydrofuran (dehydrated), then, an atmosphere in the system was purged with a nitrogen gas by bubbling a nitrogen gas. To this solution was added 0.94 g of bis(1.5-cyclooctadiene)nickel(0) {Ni(COD)$_2$}, and the mixture was stirred at room temperature for 10 minutes, then, heated up and reacted at 60° C. for 3 hours. The reaction was carried out in a nitrogen atmosphere.

This reaction liquid was cooled, then, to this was added methanol 40 ml/ion exchanged water 40 ml mixed solution, and the mixture was stirred for about 1 hour. Then, the produced precipitate was recovered by filtration. Then, this precipitate was dried under reduced pressure, then, dissolved in toluene. Insoluble materials were removed by filtrating this toluene solution. Then, this toluene solution was purified by passing through a column filled with alumina. Then, this toluene solution was washed with 1 N hydrochloric acid, then, allowed to stand still, and liquid separation was caused and the toluene solution was recovered. Next, this toluene solution was washed with ca. 3% ammonia water, then, allowed to stand still, and liquid separation was caused and the toluene solution was recovered. Next, this toluene solution was washed with ion exchanged water, then, allowed to stand still, and liquid separation was caused and the toluene solution was recovered. Next, this toluene solution was poured into methanol, and purified by re-precipitation. The produced precipitate was recovered, and washed with ethanol, then, this precipitate was dried under reduced pressure, to obtain 0.16 g of a polymer. The resultant polymer is called polymer compound (5).

This polymer compound (5) had a polystyrene reduced number average molecular weight of $5.2 \times 10^4$ and a polystyrene reduced weight average molecular weight of $2.3 \times 10^5$. The structure of a repeating unit contained in polymer compound (5) estimated from charging is shown below.

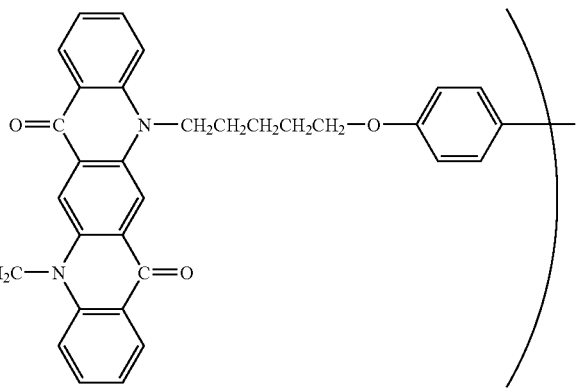

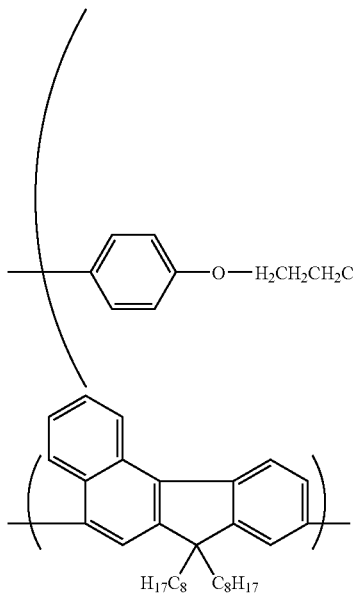

Comparative Example 1

Synthesis of Polymer Compound (6)

A polymer was obtained in the same manner as in Example 7 excepting that monomer (3) was not used. The resultant polymer is called polymer compound (6).

This polymer compound (6) had a polystyrene reduced number average molecular weight of $8.2 \times 10^4$ and a polystyrene reduced weight average molecular weight of $2.5 \times 10^5$. The structure of a repeating unit contained in polymer compound (6) estimated from charging is shown below.

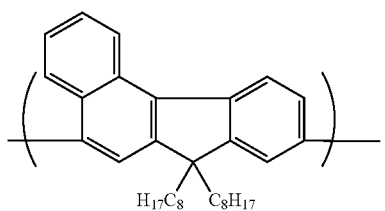

Example 8

Measurement of Absorption Spectrum, Fluorescent Spectrum

Polymer compounds (5) and (6) could be dissolved in toluene easily. Its 0.8% toluene solution was spin-coated on a quartz plate to form a thin film of the polymer compound. The fluorescent spectrum of this thin film was measured by JASCO FP-6500 spectrofluorometer.

The fluorescent peak wavelength of polymer compounds (5) was 524 nm and the fluorescent peak wavelength of polymer compounds (6) was 450 nm Example 9

Manufacturing and Evaluation of Device

On a glass substrate carrying thereon an ITO film with a thickness of 150 nm formed by a sputtering method, a solution prepared by filtrating a suspension of poly(3,4)ethylenedioxythiophene/polystyrenesulfonic acid (manufactured by Bayer, BaytronP AI4083) through a 0.2 µm membrane filter was spin-coated to form a thin film with a thickness of 70 nm, and dried on a hot plate at 200° C. for 10 minutes. Next, a 1.5 wt % toluene solution of polymer compound (5) was spin-coated to form a film with a thickness of 75 nm. Further, this was dried at 80° C. under reduced pressure for 1 hour, then, lithium fluoride was vapor-deposited with a thickness of about 4 nm, then, as a cathode, calcium was vapor-deposited with a thickness of about 5 nm, then, aluminum was vapor-deposited with a thickness of about 80 nm, to manufacture a polymer LED. After the degree of vacuum reached $1 \times 10^{-4}$ Pa or less, vapor-deposition of a metal was initiated.

By applying voltage on the resultant device, EL light emission showing a peak at 525 nm was obtained from this device. C.I.E. color coordinate values at 100 cd/m² were x=0.35 and y=0.59, and the emitted color was green. The intensity of EL light emission was approximately in proportion to current density.

This device showed initiation of light emission from 5.6 V, and the maximum light emitting efficiency was 0.91 cd/A.

Comparative Example 2

Manufacturing and Evaluation of Device

An EL device was manufactured in the same manner as in Example 9 excepting that polymer compound (6) was used instead of polymer compound (5).

By applying voltage on the resultant device, EL light emission showing a peak at 460 nm was obtained from this device. C.I.E. color coordinate values at 100 cd/m$^2$ were x=0.15 and y=0.16, and the emitted color was blue. The intensity of EL light emission was approximately in proportion to current density. This device showed initiation of light emission from 3.6 V, and the maximum light emitting efficiency was 0.4 cd/A.

INDUSTRIAL APPLICABILITY

The polymer compound of the present invention is useful as a light emitting material. The polymer light emitting device using this polymer compound shows high performance, and can be used as an apparatus such as a sheet light source as back light, flat panel display or the like.

The invention claimed is:

1. A polymer compound having one or more repeating units of the following formula (A) and containing further a structure of the following formula (B) as a complete structure:

—Ar—     (A)

wherein, Ar represents an arylene group, divalent heterocyclic group, divalent aromatic amine group or divalent group having a metal complex structure

wherein, A ring and B ring represent each independently an aromatic ring optionally having a substituent, X represents —C(=O)—, —S(=O)—, —S(=O)$_2$—, —P(=O)(R$_1$)—, —C(R$_1$)(R$_2$)—, —C(R$_2$)(R$_2$)—, —B(R$_1$)—, R* represents a hydrogen atom or monovalent or divalent group, R$_1$ represents a hydrogen atom or monovalent group, and R$_2$ represents a monovalent group having a hetero atom, and when R$_1$ and R$_2$ are present each in plural number, they may be the same or different, wherein the polystyrene reduced number average molecular weight is 10$^3$ to 10$^8$, and wherein the polymer compound contains a structure of the above-described formula (B) at any of the main chain and end of the polymer compound.

2. The polymer compound according to claim 1 wherein the light emitting wavelength of a polymer compound composed of a structure of said formula (B) is longer by 30 nm or more than the light emitting wavelength of a polymer compound composed of a structure of said formula (A).

3. The polymer compound according to claim 1, having a structure of the following formula (1):

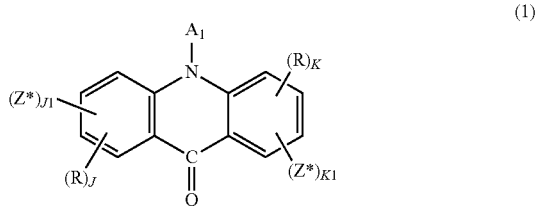

wherein, A$_1$ represents a hydrogen atom, alkyl group, aryl group, arylalkyl group, aryloxyalkyl group, monovalent heterocyclic group or divalent group, R represents a hydrogen atom, alkyl group, alkoxy group, alkylthio group, alkylsilyl group, alkylamino group, aryl group, aryloxy group, arylalkyl group, arylalkoxy group, arylalkenyl group, arylalkynyl group, arylamino group, monovalent heterocyclic group or cyano group, Z*s represent each independently a direct bond or R, J and K represent each independently an integer from 0 to 3, J1 and K1 represent each independently 0 or 1, and when a plurality of Rs are present, they may be the same or different.

4. The polymer compound according to claim 3, containing a repeating unit of the following formula (2):

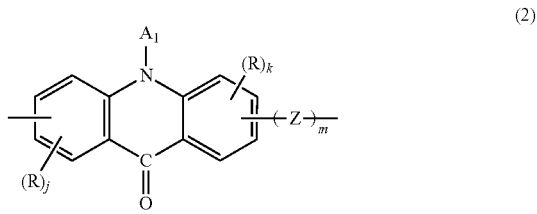

wherein, Z represents —CR$_3$=CR$_4$— or —C≡C—, R$_3$ and R$_4$ represent each independently a hydrogen atom, alkyl group, aryl group, monovalent heterocyclic group or cyano group, j and k represent each independently an integer of 0 to 3, m represents 0 or 1, and A1 and R are as described above.

5. The polymer compound according to claim 4, further containing a repeating unit of the following formula (30):

—Ar$_1$—(Z')$_p$—     (30)

wherein, Ar$_1$ represents an arylene group, divalent heterocyclic group or divalent aromatic amine group, Z' represents —CR$_5$=CR$_6$— or —C≡C—, R$_5$ and R$_6$ represent each independently a hydrogen atom, alkyl group, aryl group, monovalent heterocyclic group or cyano group, and p represents 0 or 1.

6. A polymer compound composed of a repeating unit of said formula (2) wherein m is 0.

7. A composition comprising at least one material selected from the group consisting of hole transporting materials, electron transporting materials and light emitting materials and at least one of the polymer compound according to claim 1.

8. An ink composition comprising the polymer compound according to claim 1.

9. A thin film comprising the polymer compound according to claim 1.

10. An electrically conductive thin film comprising the polymer compound according to claim 1.

11. An organic semiconductor thin film comprising the polymer compound according to claim 1.

12. An organic transistor having the organic semiconductor thin film according to claim 11.

13. A polymer light emitting device having an organic layer containing the polymer compound according to claim 1 between electrodes composed of an anode and a cathode.

14. The polymer light emitting device according to claim 13 wherein said organic layer is a light emitting layer.

15. The polymer light emitting device according to claim 14 wherein said light emitting layer contains further a hole transporting material, electron transporting material or light emitting material.

16. The polymer light emitting device according to claim 13 wherein a light emitting layer and a charge transporting layer are present between the electrodes composed of an anode and a cathode and the charge transporting layer contains a polymer compound one or more repeating units of the following formula (A) and containing further a structure of the following formula (B) as a complete structure:

—Ar— (A)

wherein, Ar represents an arylene group, divalent heterocyclic group, divalent aromatic amine group or divalent group having a metal complex structure,

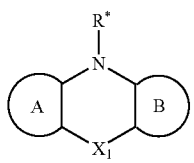

(B)

wherein, A ring and B ring represent each independently an aromatic ring optionally having a substituent, X represents —C(=O)—, —S(=O)—, —S(=O)$_2$—, —P(=O)(R$_1$)—, —C(R$_1$)(R$_2$)—, —C(R$_2$)(R$_2$)—, —B(R$_1$)—, R* represents a hydrogen atom or monovalent or divalent group, R$_1$ represents a hydrogen atom or monovalent group, and R$_2$ represents a monovalent group having a hetero atom, and when R$_1$ and R$_2$ are present each in plural number, they may be the same or different, wherein the polystyrene reduced number average molecular weight is $10^3$ to $10^8$, and wherein the polymer compound contains a structure of the above-described formula (b) at any of the main chain and end of the polymer compound.

17. The polymer light emitting device according to claim 13 wherein a light emitting layer and a charge transporting layer are present between the electrodes composed of an anode and a cathode, a charge injection layer is present between the charge transporting layer and the electrode and the charge injection layer contains a polymer compound one or more repeating units of the following formula (A) and containing further a structure of the following formula (B) as a complete structure:

—Ar— (A)

wherein, Ar represents an arylene group, divalent heterocyclic group, divalent aromatic amine group or divalent group having a metal complex structure,

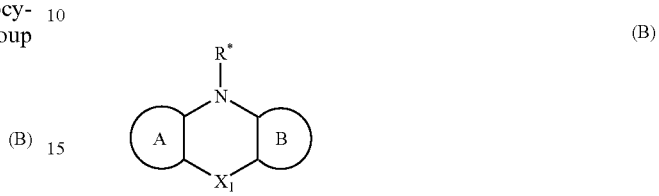

wherein, A ring and B ring represent each independently an aromatic ring optionally having a substituent, X represents —C(=O)—, —S(=O)—, —S(=O)$_2$—, —P(=O)(R$_1$)—, C(R$_1$)(R$_2$)—, —C(R$_2$)(R$_2$)—, —B(R$_1$)—, R* represents a hydrogen atom or monovalent or divalent group, R$_1$ represents a hydrogen atom or monovalent group, and R$_2$ represents a monovalent group having a hetero atom, and when R$_1$ and R$_2$ are present each in plural number, they may be the same or different, wherein the polystyrene reduced number average molecular weight is $10^3$ to $10^8$, and wherein the polymer compound contains a structure of the above-described formula (B) at any of the main chain and end of the polymer compound.

18. A sheet light source using the polymer light emitting device according to claim 13.

19. A segment display using the polymer light emitting device according to claim 13.

20. A dot matrix display using the polymer light emitting device according to claim 13.

21. A liquid crystal display using as backlight the polymer light emitting device according to claim 13.

* * * * *